US007236386B2

(12) United States Patent
Parkin

(10) Patent No.: US 7,236,386 B2
(45) Date of Patent: *Jun. 26, 2007

(54) SYSTEM AND METHOD FOR TRANSFERRING DATA TO AND FROM A MAGNETIC SHIFT REGISTER WITH A SHIFTABLE DATA COLUMN

(75) Inventor: Stuart S. P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 181 days.

This patent is subject to a terminal disclaimer.

(21) Appl. No.: 11/004,413

(22) Filed: Dec. 4, 2004

(65) Prior Publication Data

US 2006/0120132 A1 Jun. 8, 2006

(51) Int. Cl.
*G11C 7/00* (2006.01)
(52) U.S. Cl. ......................... 365/80; 365/158; 365/171; 365/173
(58) Field of Classification Search ........... 365/189.12, 365/80, 171, 173, 158
See application file for complete search history.

(56) References Cited

U.S. PATENT DOCUMENTS

| 3,333,255 A | 7/1967 | Loev ............................ 365/83 |
| 3,369,225 A | 2/1968 | Fuller .......................... 365/87 |
| 3,611,328 A | 10/1971 | Spain ................... 340/174 TF |
| 3,846,770 A | 11/1974 | Schwee et al. ............. 340/174 |
| 3,868,659 A | 2/1975 | Schwee ....................... 340/174 |
| 3,997,885 A | 12/1976 | Battarel ...................... 340/174 |
| 4,075,612 A | 2/1978 | Johnson et al. ............. 365/171 |
| 4,075,613 A | 2/1978 | Torok .......................... 365/87 |

(Continued)

OTHER PUBLICATIONS

Y.Ooba et al., "A Thin Magnetic Film Shift Register," Paper 6.4, presented at the 1972 INTERMAG Conference, Kyoto, Japan, Apr. 10-13, 1972.

(Continued)

*Primary Examiner*—Richard T. Elms
*Assistant Examiner*—N Nguyen
(74) *Attorney, Agent, or Firm*—Samuel A. Kassatly

(57) ABSTRACT

A magnetic shift register utilizes a data column comprising a thin wire of magnetic material. A writing element selectively changes the direction of the magnetic moment in the magnetic domains to write the data to the data column. Associated with each domain wall are large magnetic fringing fields concentrated in a very small space. These magnetic fringing fields write to and read from the magnetic shift register. When the domain wall is moved close to another magnetic material, the fringing fields change the direction of the magnetic moment in the magnetic material, effectively "writing" to the magnetic material. A reading element similar to a tunneling junction comprises a free layer and a pinned layer of magnetic material. Fringing fields change the direction of the magnetic moment in the free layer with respect to the pinned layer, changing electrical resistance of the reading element and "reading" data stored in the magnetic shift register.

56 Claims, 16 Drawing Sheets

U.S. PATENT DOCUMENTS

| | | | |
|---|---|---|---|
| 4,080,591 A | 3/1978 | Torok | 365/171 |
| 4,192,012 A | 3/1980 | Schwee et al. | 365/87 |
| 4,199,819 A | 4/1980 | Schwee et al. | 365/87 |
| 4,250,565 A | 2/1981 | Cosimini et al. | 365/87 |
| 4,253,160 A | 2/1981 | Paul et al. | 365/87 |
| 4,253,161 A | 2/1981 | Paul et al. | 365/87 |
| 4,410,963 A | 10/1983 | Lo et al. | 365/87 |
| 4,962,477 A | 10/1990 | Schwee | 365/87 |
| 5,197,025 A | 3/1993 | Schwee | 365/87 |
| 5,650,958 A | 7/1997 | Gallagher et al. | 365/173 |
| 5,729,410 A | 3/1998 | Fontana, Jr. et al. | 360/113 |
| 5,801,984 A | 9/1998 | Parkin | 365/158 |
| 6,438,025 B1 * | 8/2002 | Skarupo | 365/158 |
| 6,438,026 B2 | 8/2002 | Gilles et al. | 365/158 |
| 7,031,178 B2 * | 4/2006 | Parkin | 365/80 |
| 2002/0101761 A1 | 8/2002 | Naji | 365/171 |
| 2002/0181275 A1 * | 12/2002 | Sunaga et al. | 365/171 |
| 2003/0107833 A1 | 6/2003 | Rettner et al. | 360/48 |
| 2003/0128460 A1 | 7/2003 | Zolla | 360/97.01 |

OTHER PUBLICATIONS

Hermann Deichelmann, "Magnetic Domain Tip Memories—Construction and Applications," Journal of Magnetism and Magnetic Materials 4 (1977) 174-179.

D.H. Smith, "A Magnetic Shift Register Employing Controlled Domain Wall Motion," IEEE Transaction on Magnetics, vol. Mag-1, No. 4, Dec. 1965, pp. 281-284.

J. S. Sallo et al., "An "ORTHOCORE" Magnetic Shift Register," IEEE Transactions on Magnetics, vol. MAG-2, No. 3, Sep. 1966, pp. 197-201.

L. Geppert, "The New Incredible Memories," IEEE Spectrum, Apr. 2003, pp. 49-54.

Richard Butner, "Computing Unplugged, Magnetic RAM cures your computer of short-ter memory loss," available at : http://www.research.ibm.com/thinkresearch/pages/2001/20010202_mram.shtml, as of May 14, 2003.

* cited by examiner

500

```
┌─────────────────────────────┐
│ Determine Number of Bits to │ ─── 505
│    Move Chosen Domain       │
└─────────────────────────────┘
              ↓
┌─────────────────────────────┐
│   Determine Direction to    │ ─── 510
│    Move Chosen Domain       │
└─────────────────────────────┘
              ↓
┌─────────────────────────────┐
│ Determine Number of Bits to │ ─── 515
│    Move Chosen Domain       │
└─────────────────────────────┘
              ↓
┌─────────────────────────────┐
│ Determine Number of Bits to │ ─── 520
│    Move Chosen Domain       │
└─────────────────────────────┘
              ↓
┌─────────────────────────────┐
│ Determine Number of Bits to │ ─── 525
│    Move Chosen Domain       │
└─────────────────────────────┘
```

FIG 5.

Domain Wall moves, carrying Write field past data register

Crosspoint Array

SYSTEM AND METHOD FOR TRANSFERRING DATA TO AND FROM A MAGNETIC SHIFT REGISTER WITH A SHIFTABLE DATA COLUMN

CROSS-REFERENCE TO RELATED APPLICATIONS

The present application is related to co-pending U.S. patent applications Ser. No. 10/458,554, titled "Shiftable Magnetic Shift Register and Method of Using the Same," and Ser. No. 10/458,147, titled "System and Method for Writing to a Magnetic Shift Register," both of which were filed on Jun. 10, 2003, and are incorporated herein by reference in their entirety.

FIELD OF THE INVENTION

The present invention generally relates to memory storage systems, and particularly to a memory storage system that uses the magnetization of magnetic domains, such as magnetic domain walls to store data. Specifically, the present invention relates to a magnetic shift register comprised of a data column, and a writing element and a reading element for data stored in the data column.

BACKGROUND OF THE INVENTION

The two most common conventional non-volatile data storage devices are disk drives and solid-state random access memories (RAM). Disk drives are capable of inexpensively storing large amounts of data, i.e., greater than 100 GB. However, disk drives are inherently unreliable. A hard drive comprises a fixed read/write head and a moving medium upon which data are written. Devices with moving parts tend to wear out and fail. Solid-state random access memories currently store data on the order of 1 GB (gigabyte) per device, and are relatively expensive, per storage unit, compared to a disk drive.

The most common type of solid-state RAM is flash memory. Flash memory relies on a thin layer of polysilicon that is disposed in oxide below an on-off control gate of a transistor. This layer of polysilicon is a floating gate, isolated by the silicon from the control gate and the transistor channel. Flash memory is relatively slow, with reading and writing times on the order of a microsecond. In addition, flash memory cells can begin to lose data after less than a million write cycles. While this may be adequate for some applications, flash memory cells may begin to fail rapidly if used constantly to write new data, such as in the main memory of a computer. Further, the access time for flash memory is much too long for computer applications.

Another form of RAM is the ferroelectric RAM, or FRAM. FRAM stores data based on the direction that ferroelectric domains point. FRAM has access times much faster than Flash memory and consumes less energy than standard dynamic random access memory (DRAM). However, commercially available memory capacities are currently low, on the order of 1 MB (megabyte). In addition, memory storage in a FRAM relies on physically moving atoms, leading to eventual degradation of the medium and failure of the memory.

Yet another form of RAM is the Ovonic Unified Memory (OUM) that utilizes a material that alternates between crystalline and amorphous phases to store data. The material used in this application is a chalcogenide alloy. After the chalcogenide alloy experiences a heating and cooling cycle, it can be programmed to accept one of two stable phases: polycrystalline or amorphous. The differences in the respective resistances of the two phases allow the chalcogenide alloy to be used as memory storage. Data access time is on the order of 35 ns. However, the size of these memories is still small, on the order of 4 MB currently. In addition, OUM relies on physically changing a material repeatedly to and from crystalline and amorphous states, likely causing the material to eventually degrade and fail.

Semiconductor magnetoresistive RAM (MRAM) encodes data bits in a ferromagnetic material by utilizing the direction of the magnetic moment of the material. Atoms in ferromagnetic materials respond to external magnetic fields, aligning their magnetic moments to the direction of the applied magnetic field. When the field is removed, the magnetic moments of the atoms still remain aligned in the induced direction. A field applied in the opposite direction causes the atoms to realign themselves with the new direction. Typically, the magnetic moments of the atoms within a volume of the ferromagnetic material are aligned parallel to one another by a magnetic exchange interaction. These atoms then respond together, largely as one macro-magnetic moment, or magnetic domain, to the external magnetic field.

One approach to MRAM uses a magnetic tunneling junction as the memory cell. The magnetic tunneling junction comprises two layers of ferromagnetic material separated by a thin insulating material. The direction of the magnetic domains is fixed in one layer. In the second layer, the domain direction is allowed to move in response to an applied field. Consequently, the direction of the domains in the second layer can either be parallel or opposite to the first layer, allowing the storage of data in the form of ones and zeros. However, currently available MRAM can only store up to 4 Mb (megabits), much less than needed for most memory applications. Larger memories are currently in development. In addition, each MRAM memory cell stores only one bit of data, thereby limiting the maximum possible memory capacity of such devices.

A magnetic shift register replaces many conventional memory devices including but not limited to magnetic recording hard disk drives, and many solid-state memories such as Flash, DRAM, SRAM, FeRAM, and MRAM. The magnetic shift register provides capacious amounts of storage comparable to those provided in conventional memory devices but without any moving parts and at a cost comparable to hard disk drives.

What is needed is an improved configuration for the magnetic data tracks and a method for writing to and reading from the improved configuration.

SUMMARY OF THE INVENTION

The present invention satisfies this need, and presents a system and an associated method (collectively referred to herein as "the system" or "the present system") for a magnetic shift register utilizing a data column, writing element, and reading element.

According to a preferred embodiment of the present invention, one read element and/or one write element is/are dedicated to a single data column, with the understanding that in other embodiments, more than one read and/or write element can be positioned along the length of the data column.

In a preferred embodiment, the reading element comprises a magnetic tunneling junction. By incorporating the magnetic shift register as part of a magnetic tunneling junction, information stored in the domains in the magnetic shift register can be read by the current that passes through the magnetic tunnel junction. As the domains flow past the magnetic tunneling junction, the magnitude of the current indicates the value stored by the direction of the domain. Moving the domains around the magnetic shift register brings the chosen domain to the magnetic tunneling junction for reading purposes.

The reading element may comprise part of the track or, alternately, and may be positioned at some distance close to, but not necessarily connected to the track. In this latter case, the magnetic tunnel junction reading element detects the orientation of the magnetic domains in the track by detecting the fringing fields from these domain walls as they pass along the track, wherein the fringing fields change the orientation of the sensing layer of the magnetic tunnel junction reading element.

The reading element comprises a pinned layer with a fixed magnetic moment and a free (sense) layer with a magnetic moment that can be changed by application of an external magnetic field such as the fringing field from a domain wall, wherein the pinned layer and the sense layer are separated by a thin tunnel barrier so forming a magnetic tunnel junction (MTJ). The resistance of the MTJ varies according to the relative orientation of the magnetic moments of the sense and pinned layers so that the orientation of the sense layer magnetic moment will cause the resistance of the MTJ to be varied. It may be advantageous to form the MTJ from ferromagnetic electrodes and tunnel barrier materials that give rise to high TMR values, for example, MgO tunnel barriers and ferromagnetic electrodes formed from crystalline or amorphous alloys of Co and Fe.

The reading element can be positioned such that the magnetic moment of the pinned layer of the tunneling junction is perpendicular to the circumference of the data column. Further, the magnetic moment of the pinned layer of the tunneling junction can be parallel or tangential to the circumference of the data column. The direction of the pinned layer of the reading element is chosen to optimize the sensitivity of the reading element to the presence of the domains or domain walls in the race track.

In one embodiment, the magnetic moment of the pinned layer of the tunneling junction can be preferably parallel to the length of the data column. In this embodiment, the reading element is separated from the data column by a layer of insulation, allowing the reading element to be fabricated as part of the data column: In another embodiment, the reading element abuts against the data column.

The magnetic moment of the free (sense) layer can be parallel and oriented in the same direction as the magnetic moment of the pinned layer. In this case, application of a fringing field to the reading element causes the magnetic moment of the free (sense) layer to rotate 180° and point in a direction opposite that of the magnetic moment of the pinned layer.

In one embodiment, the magnetic moment of the free (sense) layer is biased in a direction that is perpendicular to that of the magnetic moment of the pinned layer. Application of the fringing field to the reading element causes the magnetic moment of the free (sense) layer to rotate up to 90° and align itself either more closely with the direction of the magnetic moment of the pinned layer, or to align itself more closely in the opposite direction of the magnetic moment of the pinned layer. This embodiment allows a reading element more sensitivity to the fringing fields of the domains, providing reading of data in the magnetic shift register with lower magnitude fringing fields or for faster operation.

The capacity of the magnetic shift register can be varied over a wide range continuously by simply varying the number of magnetic shift register data columns per memory device. This is a particular advantage over magnetic hard disk drives whose reading and writing heads and their circuitry, and the mechanical means of moving these heads and the magnetic media are expensive. A hard disk drive only provides a cheap means of storage when many gigabytes of data are stored, such that the cost of the mechanical components of the hard disk drive is amortized over the large number of data bits.

By contrast, the magnetic shift register can be built at low cost per bit in much smaller sizes, thereby allowing the magnetic shift register to be used for a wide range of applications where the data storage capacity required is much lower than that of a magnetic hard disk drive. Thus the magnetic shift register can be used for various electronic devices including by way of example, but not limited to: digital cameras, personal digital assistants, security devices, memory sticks, removable storage devices, and so forth.

A preferred magnetic shift register memory device described herein comprises the storage of information in magnetic wires that are largely orthogonal to a plane that comprises reading and writing elements. These reading and writing elements are constructed using conventional CMOS technology. The magnetic shift register memory promises a 100-fold increase in density compared to conventional CMOS memories. The magnetic wires can be formed as tall (e.g., approximately 10 microns) and narrow (e.g., approximately 0.1 micron) columns.

Briefly, the magnetic shift register memory device uses the inherent, natural properties of the domain walls in ferromagnetic materials to store data. The magnetic shift register memory device utilizes one read/write device to access numerous bits, on the order of 100 bits of data or more. Consequently, a small number of logic elements can access hundreds of bits of data.

The magnetic shift register memory device uses spin-based electronics to write and read data in ferromagnetic material so that the physical nature of the material in the magnetic shift register is unchanged. A shiftable magnetic shift register comprises a data track formed of a fine wire or strip of material made of ferromagnetic material. The wire can be comprised of a physically uniform, magnetically homogeneous ferromagnetic material or layers of different ferromagnetic materials. Information is stored as direction of magnetic moment within the domains in the track. The wire can be magnetized in small sections in one direction or another.

An electric current is applied to the track to move the magnetic domains along the track in the direction of the electric current, past reading or writing elements or devices. In a magnetic material with domain walls, current passed across the domain wall moves the domain wall in the direction of the current flow. As the current passes through a domain, it becomes "spin polarized". When this spin-polarized current passes into the next domain across. a domain wall, it develops a spin torque. This spin torque moves the domain wall. Domain wall velocities can be very high, on the order of one to several hundred m/sec. The actual direction in which the domain walls move will depend on the composition of the magnetic material of the track. The domain walls can move either in the same direction as that of the direction in which the electrons flow or in the opposite direction to the flow of the electrons. For a particular material, changing the direction of the current will also change the direction in which the domains and the domain walls move, allowing the domains and the domain walls to be moved in either direction along the track.

In summary, current passed through the track (having a series of magnetic domains with alternating directions) can move these domains past the reading and writing elements. The reading element can then read the direction of the magnetic moments, thus reading the data stored in the domains. The writing element can change the direction of the magnetic moments, thus writing information to the track.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 5 is a process flow chart illustrating a method of operation of the magnetic shift register of FIG. 1 according to the present invention;

DETAILED DESCRIPTION OF PREFERRED EMBODIMENTS

The following definitions and explanations provide background information pertaining to the technical field of the present invention, and are intended to facilitate the understanding of the present invention without limiting its scope:

Homogeneous magnetic material means a contiguous volume of magnetic material, which may have a complex shape, which nominally has the same or similar magnetic properties, such as magnetization, magnetic anisotropy, magnetic exchange and magnetic damping, independent of the position within the volume. At the surfaces surrounding such material, these properties may differ from the properties within the interior of the volume because of differences in strain or stress, compositional gradients, reaction with the surrounding material, etc.

Inhomogeneous magnetic material means a contiguous volume of magnetic material, which may have a complex shape, whose magnetic properties, such as magnetization, magnetic anisotropy, magnetic exchange and magnetic damping, may vary with position within the volume due, for example, to a change in material composition and/or due to some physical process during the deposition of this material or acting on the material after the material has been deposited.

Figure 1:
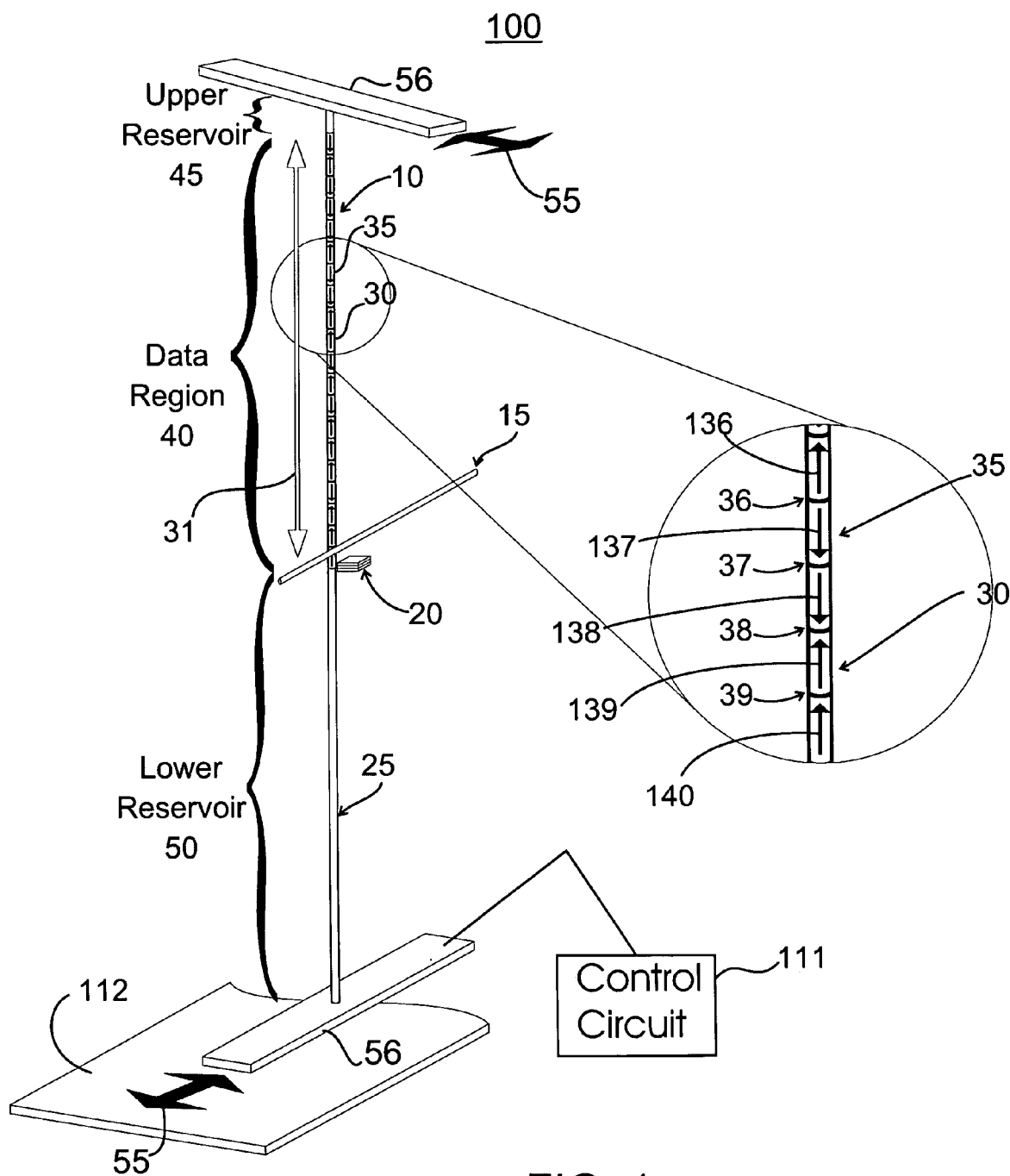
FIG. 1 is a perspective view of a magnetic memory system comprising a magnetic shift register that utilizes a writing element and a reading element, according to the present invention.

FIG. 1 illustrates an exemplary magnetic memory system 100 comprising a magnetic shift register 10 that utilizes a writing element 15 and a reading element 20. Both the reading element 20 and the writing element 15 form a read/write element of system 100.

The magnetic shift register 10 comprises a data column 25 comprised of fine wire (or track) preferably made of ferrimagnetic or ferromagnetic material. The data column 25 can be magnetized in small sections, or domains, in one direction or another, using the writing element 15.

The order parameter of the magnetic material from which the track is fabricated, that is the magnetization direction or the direction of the magnetic moment, changes from one direction to another. This variation in the direction of the magnetic moment forms the basis for storing information in the data column 25. Depending on the desired coding scheme of the shift register 10, data can be stored in magnetized regions of the shift register 10, such as the magnetic domains, e.g., 30, 35; the domain walls, e.g., 36, 37, 38, 39 that separate these domains; or both the magnetic domains, e.g., 30, 35, and the domain walls, e.g., 36, 37, 38, 39. As used herein the domains walls, e.g., 36, 37, 38, 39, are transition magnetized regions between the magnetic domains, e.g., 30, 35.

In one embodiment, at any given time during its operation, the magnetic shift register 10 is comprised of a data region 40, an upper reservoir 45, and a lower reservoir 50. The data region 40 comprises a contiguous set of domains such as domains 30, 35 that store data. Additional length is provided to the magnetic shift register 10 in the form of the upper reservoir 45 and the lower reservoir 50.

The combined length of the upper reservoir 45 and the lower reservoir 50 is sufficiently long so that it can accommodate all the domains in the data region 40 when these domains are moved completely from data region 40 across the writing element 15 and reading element 20 for the purposes of writing and reading domains in the data region 40, respectively. At any given time, the domains are thus stored partially in data region 40 and partially in the upper reservoir 45 or the lower reservoir 50. Consequently, it is the combination of data region 40, the upper reservoir 45, and the lower reservoir 50 that forms a complete storage element.

In one embodiment, the upper reservoir 45 is devoid of magnetic domains in a quiescent state. In another embodiment, the lower reservoir 50 is devoid of magnetic domains in a quiescent state.

Although, for the purposes of clarity of explanation, the data column 25 is described as being comprised of a data region 40 and two or more reservoirs 45, 50, in another embodiment, the magnetic shift register 10 includes a single reservoir 45 or 50.

The various regions 40, 45, 50 of the shift register 10 are contiguous and may be identical in structure and composition. The data region 40 is not a fixed region of the column 25, but rather the data region 40 will be shifted up and down the column during the operation of the storage device for the purposes of reading and writing data to and from the column 25. It should be clear that while the directional terms, such as up or down, are used herein, these terms are not intended to limit the implementation of the present invention to these directions.

The data region 40 at any given time can be located within a different portion of the magnetic shift register 10. Although the data region 40 can be one contiguous region, the spatial distribution and extent of the domains within the data region 40 can be approximately the same no matter where the data region 40 resides within the magnetic shift register 10. In another embodiment, the spatial extent of the storage region can be increased during the motion of this region particularly across the reading element 20 and writing element 15. A portion or the entire data region 40 is moved into the upper reservoir 45 or the lower reservoir 50 to access data in specific domains.

The upper reservoir 45 and the lower reservoir 50 shown in FIG. 1 together have approximately the same size as, or are slightly longer than the data region 40. However, other alternative embodiments can allow the upper reservoir 45 or the lower reservoir 50 to have different sizes relative to the size of the data region 40. As an example, the combined length of the upper reservoir 45 and the lower reservoir 50 can be much smaller than the data region 40 if more than one reading element 20 and writing element 15 are used for each magnetic shift register 10. For example, if two reading elements 20 and two writing elements 15 are used for one magnetic shift register 10 and are disposed equidistally along the length of the data region 40, then the upper reservoir 45 and the lower reservoir 50 together require a length that is only approximately half as long as the data region 40.

A current 55 is applied to the data column 25, via tracks 56, to move the magnetic moments within domains 30, 35, along the data column 25, and past the reading element 20 or the writing element 15. In a magnetic material with domain walls, a current passed across the domain walls moves the domain walls in the direction of the current flow. As the current passes through a domain, it becomes "spin polarized". When this spin-polarized current passes through into the next domain across the intervening domain wall, it develops a spin torque. This spin torque moves the domain wall. Domain wall velocities can be very high, i.e., on the order of 100 to several hundred m/sec, so that the process of moving a particular domain to the required position for the purposes of reading this domain or for changing its magnetic state by means of the writing element can be very short.

The actual direction in which the domain walls move when a pulse of electric current is applied to the data column 25 depends on the composition of the magnetic material of the data column 25. For example, if the data column 25 is comprise of permalloy (an alloy of approximately 80 atomic percent nickel and 20 atomic percent iron), then the domain walls 36–39 move in the direction of the flow of electrons (i.e., opposite to the direction of the flow of the current in the data column 25). This is because the electrical current flowing in the data column 25 becomes spin-polarized with a majority electron spin polarization (i.e., along the direction of the local magnetic moment of the permalloy material). If another magnetic material were used in which the current became polarized in the minority electron spin direction, then the current would move the domain walls 36–39 in the opposite direction. For example, certain alloys of Fe have this property.

In another embodiment, by using a magnetic material whose spin polarization can be varied with temperature, then temperature may be used to change the direction of the motion of the domain walls for otherwise the same direction of current flow. This may be advantageously used, for example, by reducing the size of the control circuit 111 (FIG. 1) needed to supply the current for the purposes of moving the domain walls along the data column.

It should be clear that the direction of motion of the domain walls 36–39 in the data column 25 with respect to the flow of current will depend on the magnetic material and its composition, changing the direction of the current. The current can be used to move the domain walls in opposite directions along the data column 10.

Figures 2A, 2B, 2C:
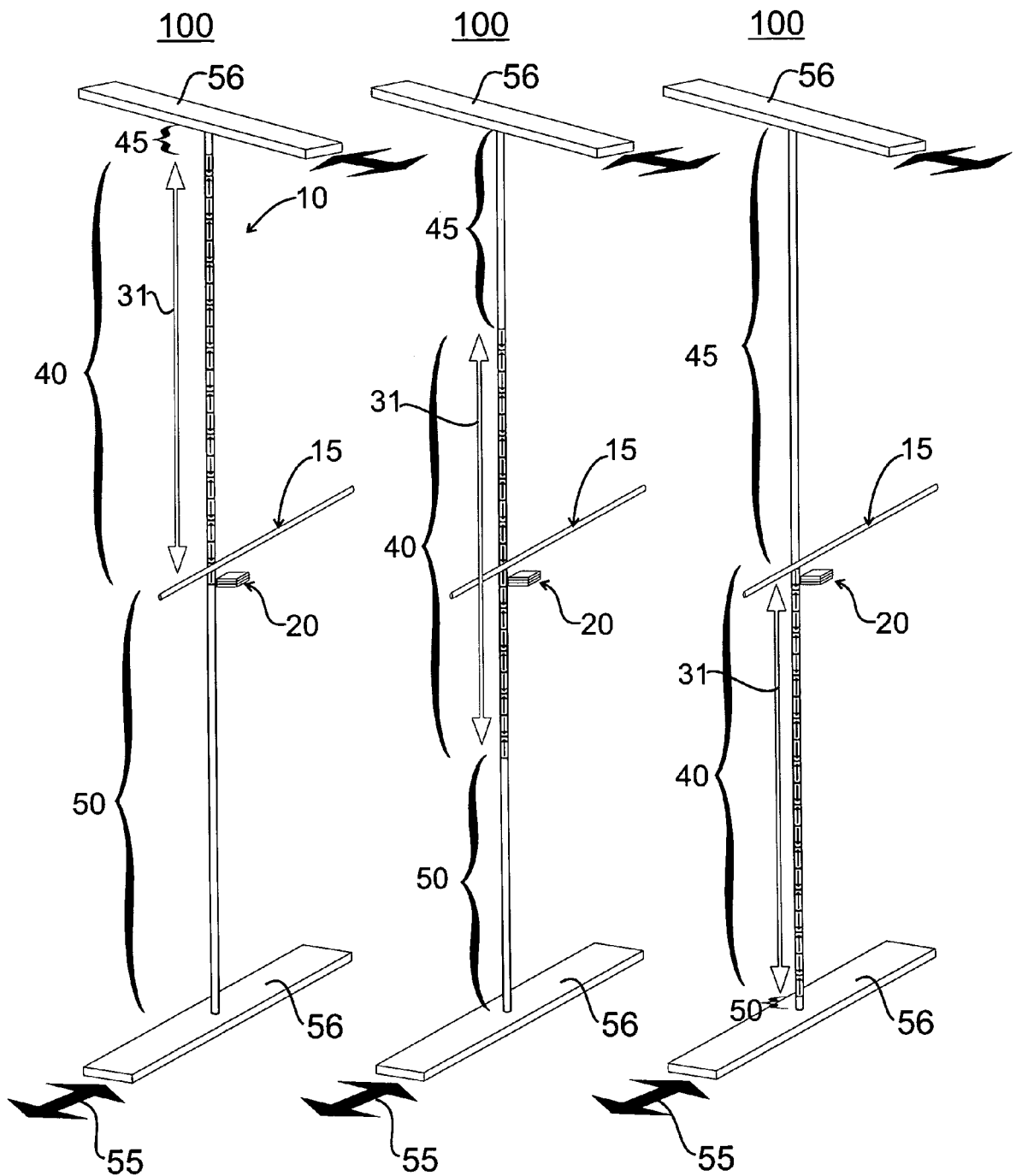
FIG. 2 is comprised of FIGS. 2A, 2B, 2C, and illustrates the movement of the domains along a data column past the writing and reading elements of the shift register of FIG. 1.

The domains, such as domains 30, 35, are moved (or shifted) back and forth past the writing element 15 and the reading element 20, to move the data region 40 in and out of the reservoirs 45, 50, as shown in FIG. 2 (FIGS. 2A, 2B, 2C). In the example of FIG. 2A, the data region 40 initially resides in the upper reservoir 45 of the magnetic shift register 10, with no domains in the lower reservoir 50. Current 55 is applied to the magnetic shift register 10 to move the data region 40 in the direction of arrow 205. FIG. 2B shows the case where the data region 40 has been moved to approximately the middle region of the track and FIG. 2C shows the data region 40 moved entirely to the lower reservoir 50 of the magnetic shift register 10. Current 55 is applied to the magnetic shift register 10 to move the data region 40 in the direction of arrow 210. In this manner, the data region 40 is shifted up and down in the data column 25.

To write data in a specific domain, such as domain 30, current 55 is applied to the magnetic shift register 10 to move domain 30 adjacent to, and in alignment with the writing element 15. All the domains 30, 35 in the data region 40 move when the current is applied to the magnetic shift register 10 but these domains 30, 35 maintain their magnetic orientation and relative disposition with respect to one another.

Although the actual separation of the domains 30, 35 may vary a little when the domains 30, 35 are moved along the data column 25, the domains 30, 35 are sufficiently extended along the track direction that the domain walls 36–39 which separate one domain 30 from the neighboring domains 35 do not overlap and annihilate each other. In one embodiment, as shown in the inset to FIG. 1, the domains 30, 35 are approximately cylindrical in shape with a length along the track column 25 which is longer than its diameter. Under these circumstances, and as shown by arrow 31 of FIG. 1, the magnetic moment of each domain, such as magnetic moments 136–140, is largely oriented along the length of data column 25. Although the track of data column 25 is shown as being linear for illustration purpose only, it should be clear that the track could assume other curvilinear shapes. The data column 25 can also be disposed at any angle relative to the substrate plane 112 and can even be horizontal. It may be advantageous to have multiple data columns 25 oriented at different angles in one shift register 10 with respect to the most advantageous packing of these data columns 25 or for making the most advantageous electrical connections to these data column 2 25.

Figure 3A:
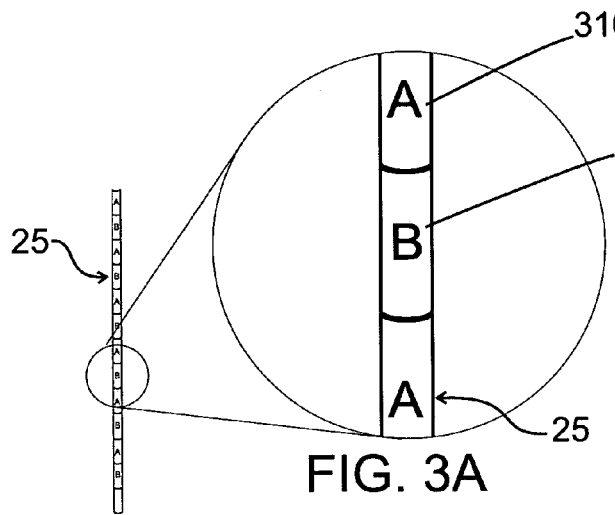
FIG. 3 is comprised of FIGS. 3A, 3B, 3C, 3AA, 3BB, 3CC, and illustrates some exemplary embodiments of the data column of the magnetic shift register of FIGS. 1 and 2.
Figure 3A:
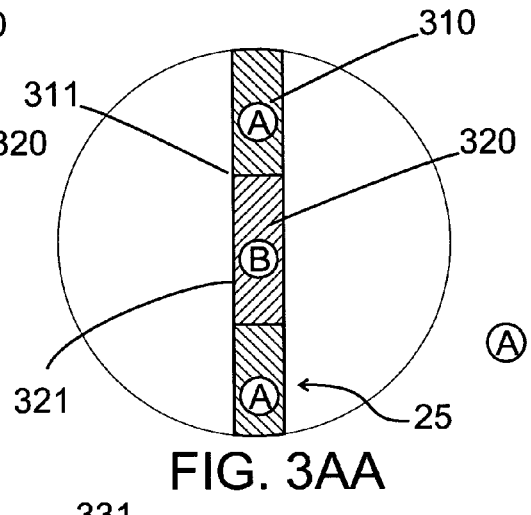
Figure 3B:
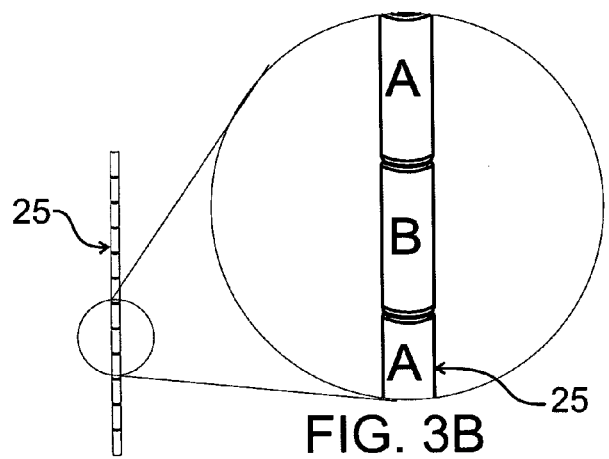
Figure 3B:
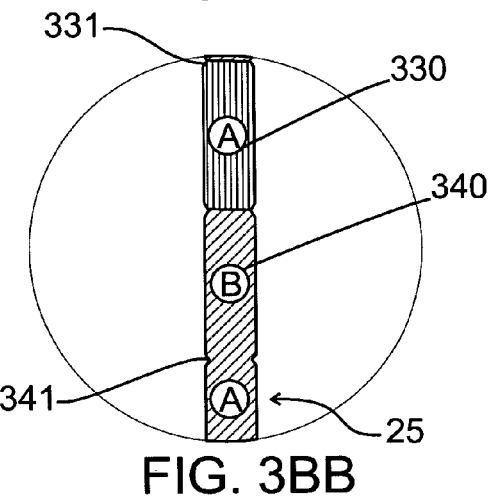
Figure 3C:
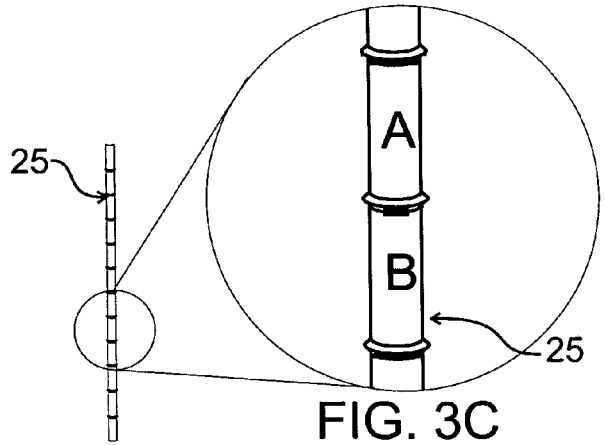
Figure 3C:
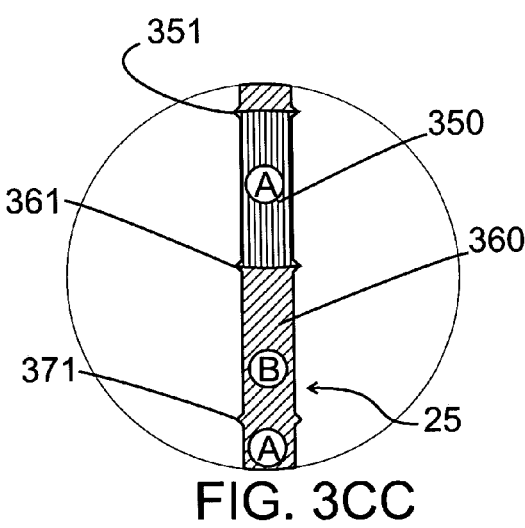

The position of the domains along the track of the data column 25 may be determined by varying the track material, the track shape, or the track dimensions along the data column 25, as illustrated in FIG. 3 (FIGS. 3A, 3B, 3C, 3AA, 3BB, 3CC). In the embodiment of FIGS. 3A and 3AA, the material of the track is alternated between two different magnetic materials A and B, whose magnetic properties are different with regard to one or more of magnetization, magnetic anisotropy, magnetic exchange etc.

FIG. 3A shows a track with a cross-section that is approximately circular in shape and FIG. 3AA shows a corresponding cross-section along the length of the track for illustration purposes. The cross-sectional shape across the wire may be circular, elliptical, square, or rectangular in shape. The track cross-section is selected for optimal motion of the domain walls 310, 320 along the track with regard to their stability, velocity along the track, and the minimum current required to move these domains 310, 320 from one site to another site along the track.

The regions or domains 310, 320 comprised of materials A and B may have different lengths so that either region A or B may be much shorter or longer than the other, so that the domain walls may be confined to the shorter region. The magnetic properties of materials A and B are chosen so that the domain walls 311, 321 have lower energy in one or other of these materials so that the domains 310, 320 are sufficiently pinned in the absence of current applied to the track that thermal fluctuations do not cause the motion of the domain walls 311, 321 away from these pinning centers, i.e., the shorter regions.

In another embodiment the track cross-section is varied in shape or size along the length of the data column 25, as illustrated in FIGS. 3B and 3BB. In FIGS. 3B and 3BB, a plurality of notches of indentations 331, 341 are selectively located at particular sites along the track where the track cross-sectional area is reduced in size. The notches 331, 341 may extend all around the outer edge of the track as shown in FIGS. 3B and 3BB. Alternatively, the notches 331, 341 may extend only partly around the circumference of the track. In another alternative embodiment, the notches 331, 341 may include two or more indentations that are not continuous, that is they are physically separated around the periphery of the track. In this embodiment, data column 25 may be comprised only of one material so that materials A and B are comprised of the same magnetic material. Alternately, materials A and B may be comprised of different magnetic materials.

In another embodiment, the track of the data column 25 includes protuberances 351, 361, 371 at distinct positions along the track, as shown in FIGS. 3C and 3CC. The diameter of the track is enlarged in specific regions for the purposed of pinning the domains walls which separate adjacent magnetic domains 350, 360. These protuberances 351, 361, 371 can have lengths which are short compared to the length of the magnetic domains 350, 360 or may be as long as the magnetic domains 350, 360 along the track. The materials A and B may be comprised of the same magnetic material.

The notches 331, 341 shown in FIGS. 3B and 3BB and the protuberances 351, 361, 371 shown in FIGS. 3C and 3CC can be fabricated along the length of the track in both the data region 40 and the reservoirs 45, 50 of the data column 25, and can be approximately equally spaced along the track.

Similarly, the alternation of materials A and B illustrated in FIGS. 3A and 3AA will be repeated along the length of the track 10 in both the data region 40 and the reservoirs 45, 50. However, the alternation of the materials A and B and the position of the notches 331, 341 and protuberances 351, 361, 371 need not be exactly equally spaced along the track for the proper operation of the data storage system 100.

Similarly, the dimensions and proportions of the notches 331, 341 and protuberances 351, 361, 371 need not be exactly identical because the critical current needed to move the domain walls is not very sensitive to these details. By contrast, the magnetic field needed to propagate the domain walls along the track is sensitive to the details of the notch and protuberance shape and dimensions. Thus, this is a particular advantage of moving the domain walls by current pulses rather than by magnetic fields.

The movement of the domains is controlled by both the magnitude and direction of the current, and the time over which the current is applied. In one embodiment, one current pulse of a specified shape (magnitude versus time) and duration is applied to move the domains in the storage region in one increment or step from one position along the track (e.g., 310, 330, 350 in FIG. 3) to an adjacent position (e.g., 320, 340, 360 in FIG. 3). A series of current pulses are applied to move the domains the required number of increments or steps.

The direction of motion of the domains within the data column 25 depends on the direction of the applied current. The length of the current pulse can be in the range of a few hundred picoseconds to tens of nanoseconds or longer and depends on the magnitude of the current. The larger the magnitude of the current the shorter the length of the current pulse needed. The shape of the current pulse (i.e., the detailed dependence of current versus time in the pulse) may also be adjusted for the optimal motion of the domain walls. In conjunction with the detailed specifics of the ferromagnetic material in the track, the shape of the current pulse is designed such that the domain walls are moved from one position to the next position without having so much energy or momentum that they move beyond the next most position.

By optimizing the magnetic properties of the material or materials which comprise the data column, especially the magnetic damping parameter of these materials, and their magnetizations and magnetic anisotropies, the motion of a series of domain walls positioned along the track, can be accomplished so that the registry of the domain walls with respect to one another is maintained, i.e., the series of domains and their associated domain walls can be shifted by one or more positions along the data column 25. The magnitude of the current required to move the domain walls and the length and shape of the current pulse needed to move the domain walls can be optimized and is dependent on the magnetic properties of the material or materials comprising the track as well as the particular area and shape of the cross-section of the track.

To read data in a specific domain, such as domain 30, additional current is applied to the magnetic shift register 10 to move domain 30 adjacent to, and in alignment with, the reading element 20. A shifted portion of the data region 40 is pushed (shifted or moved) into the lower reservoir 50.

To operate the magnetic shift register 10, the control circuit 111 (FIG. 1) comprises logic and other circuitry for a variety of purposes, including the operation of the reading element 20 and writing element 15, the provision of current pulses to move the domains within the magnetic shift register 10, and the means of coding and decoding data in the magnetic shift register 10. In one embodiment the control circuit is fabricated using CMOS processes on a silicon wafer. The magnetic shift registers 10 are preferably designed to have a small footprint on the silicon wafer so as to maximize the storage capacity of the memory device while utilizing the smallest area of silicon to keep the lowest possible cost.

In the embodiment shown in FIG. 1, the magnetic shift register 10 is comprised of the data column 25 extending largely in the direction out of the plane of the wafer which is illustrated in part and designated by the reference numeral 112. The length of the data column 25 generally lies in the vertical direction and determines the storage capacity of the magnetic shift register 10. Since the vertical extent can be significantly greater than the extent of a similar data column in the horizontal direction, the magnetic shift register 10 of FIG. 1 is capable of storing several hundred times (or a greater factor) the number of magnetic bits that can be stored in a magnetic shift register lying in the horizontal plane. Thus, the magnetic shift register 10 of FIG. 1 can store many more bits for the same area of silicon wafer as compared to conventional solid-state memories.

Although the data column 25 of the magnetic shift register 10 is shown as being largely perpendicular to the plane of the reading element 20 and writing element 15 (the circuitry plane), the data column 25 can also be inclined, at an angle, to this reference plane, as an example, for the purpose of greater density or for ease of fabrication of these devices.

Figure 4A:
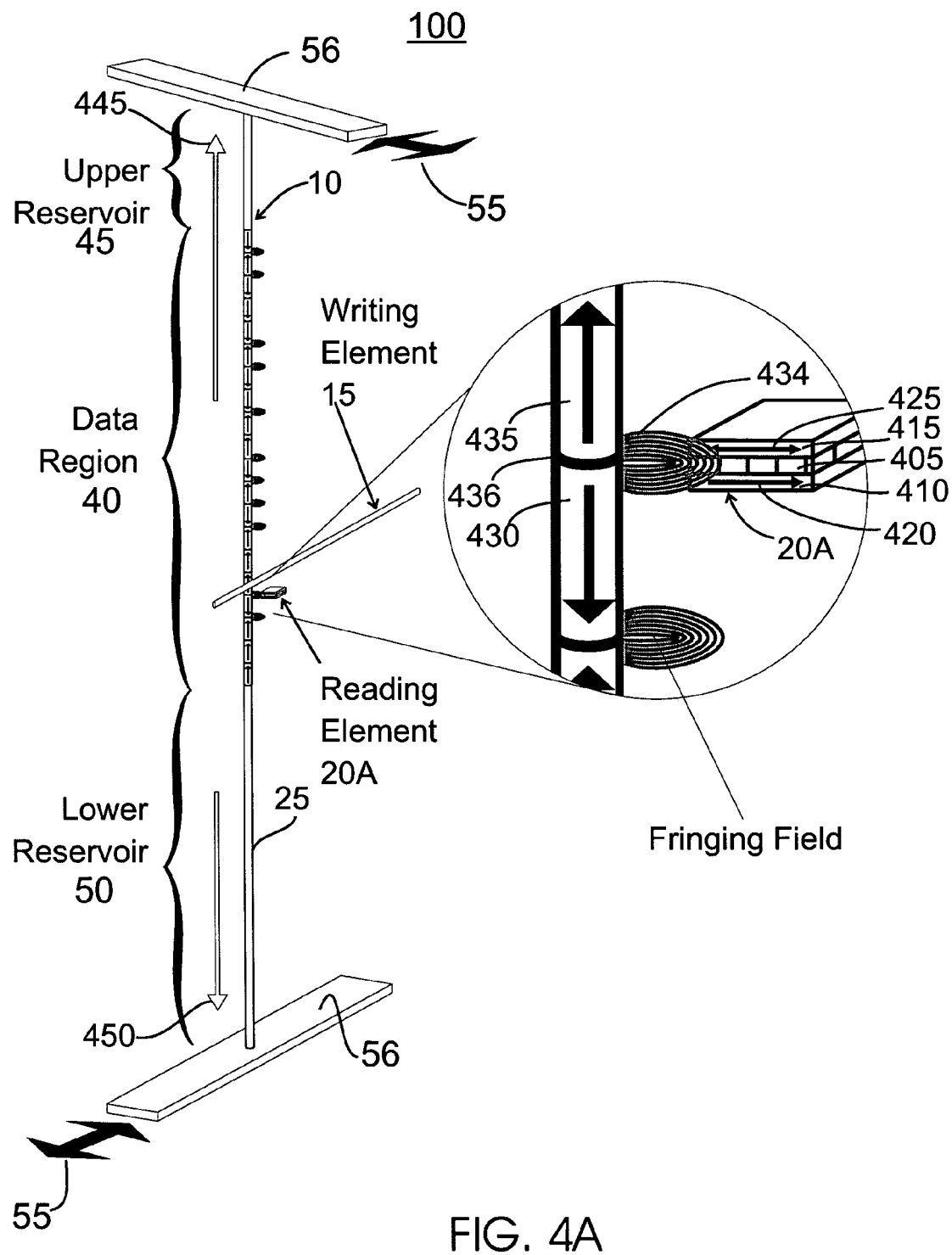
FIG. 4 is comprised of FIGS. 4A, 4B, 4C, which illustrate various embodiments of the reading element of the shift register of FIG. 1.

FIG. 4A illustrates the operation of one embodiment of the reading element 20A. The reading element 20A is adjacent to, but not in direct physical contact with the data column 25. The reading element 20A comprises a magnetic tunnel junction which includes a tunnel barrier 405, a pinned layer 410, and a free (sense) layer 415. The pinned layer 410 comprises a fixed magnetic moment 420. The free (sense) layer 415 has a free magnetic moment 425. In the absence of an external magnetic field, the free magnetic moment 425 is aligned with, and points in the same or the opposite direction as the fixed magnetic moment 420.

Current 55 moves domains 430 and 435 adjacent to the read element 20A. A fringing field 434 associated with the domain wall 436 between the domains 430 and 435 is moved across the reading element 20A. The fixed magnetic moment 420 does not move in response to the presence of the fringing field 434. On the other hand, the free magnetic moment 425 moves in response to the presence of the fringing field 434. The fringing field 434 induces a change in direction in the free magnetic moment 425, changing the electrical resistance of the reading element 20A, and allowing the reading element 20A to read the presence of the fringing field 434 and thus the data stored in domains 430 and 435.

A method 500 of operating the magnetic shift register 10 is illustrated in FIG. 5, with further reference to FIG. 4A. The memory system 100 determines, at block 505, the number of bits required to move domain 430 to either the writing element 15 or reading element 20A. The memory system 100 also determines the direction required to move domain 430 in block 510. In FIG. 4A, domain 430 is below the writing element 15 and above the reading element 20A. A positive current 55 can be required to move domain 430 up to the writing element 15 (as illustrated by arrow 445), for example, while a negative current 55 can be required to move domain 430 down to the reading element 20A (as illustrated by arrow 450).

The memory system 100 then applies the desired current 55 to the magnetic shift register 10 at block 515. Current 55 can be one pulse or a series of pulses, moving the domain 430 one bit at a time. It is also possible to vary the length of duration or the magnitude of the current within the pulse or the pulse shape (current versus time within the pulse) to cause the domain 430 within the data region 40 to move by several increments during the application of one pulse. The domains in the data region 40 move in response to the current 55 in block 520. Domain 430 stops at the desired device, i.e., the writing element 15 or the reading element 20A (block 525).

Figure 4B:
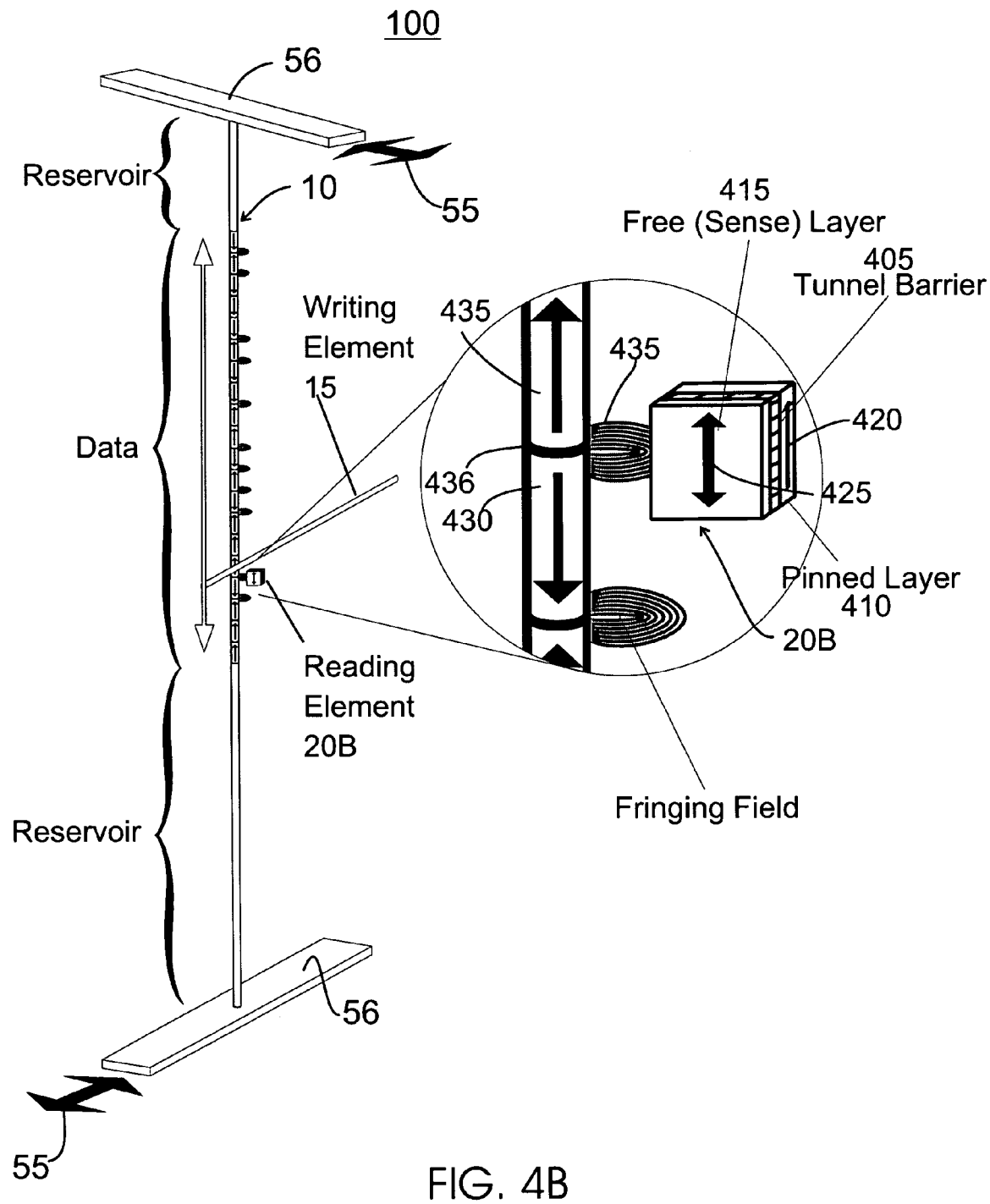
Figure 4C:
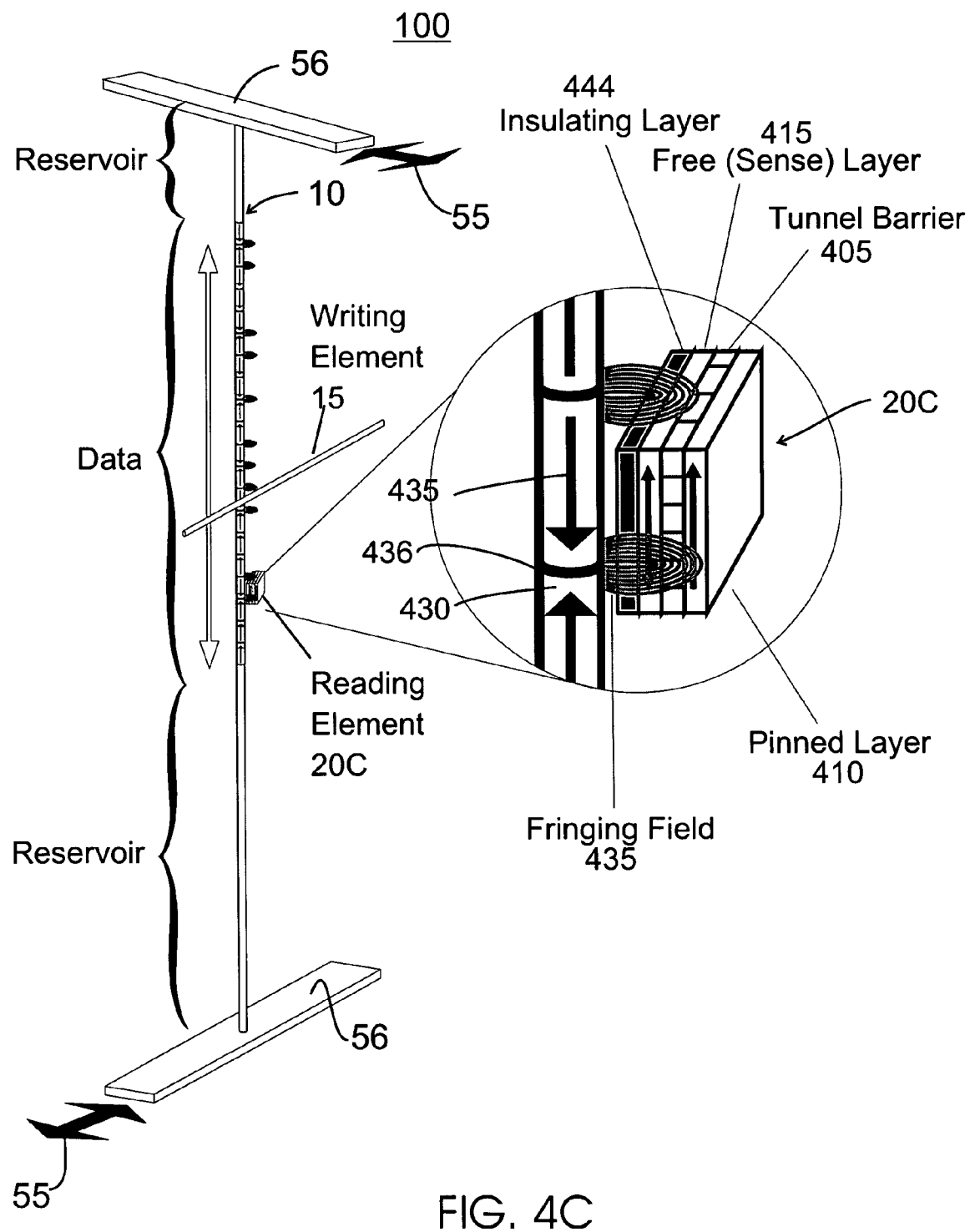

FIGS. 4B and 4C illustrate further embodiments of the reading elements 20B and 20C, respectively, in which the orientation of the magnetic tunnel junction relative to the shift register 10 are varied, such that the fixed magnetic moment 420 is largely parallel to the data column 25. In FIG. 4B and FIG. 4C the layers comprising the magnetic tunnel junction reading element 20B and 20C are in the vertical plane parallel to the length of the data column 25.

In FIG. 4B the direction perpendicular to the layers comprising the MTJ reading element is tangential to the data column 25 whereas in FIG. 4C this direction is along the radius of the data column 25. In FIG. 4C the reading element 20C is separated from the data column 25 by an insulating layer 444. The various arrangements of the reading elements 20A, 20B, 20C in FIGS. 4A, 4B, 4C, respectively, are for illustration purposes only.

Figure 6A:
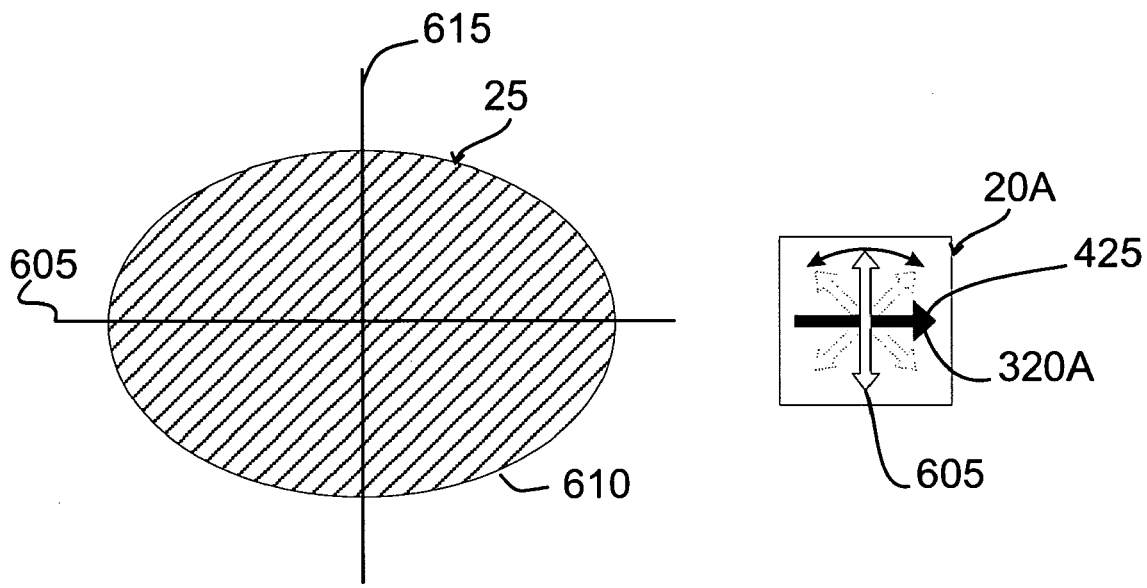
FIG. 6 is comprised of FIGS. 6A and 6B, which illustrate cross sections of the data column and the alignment of the moments of the pinned and sensing layers in the reading element according to the present invention.
Figure 6B:
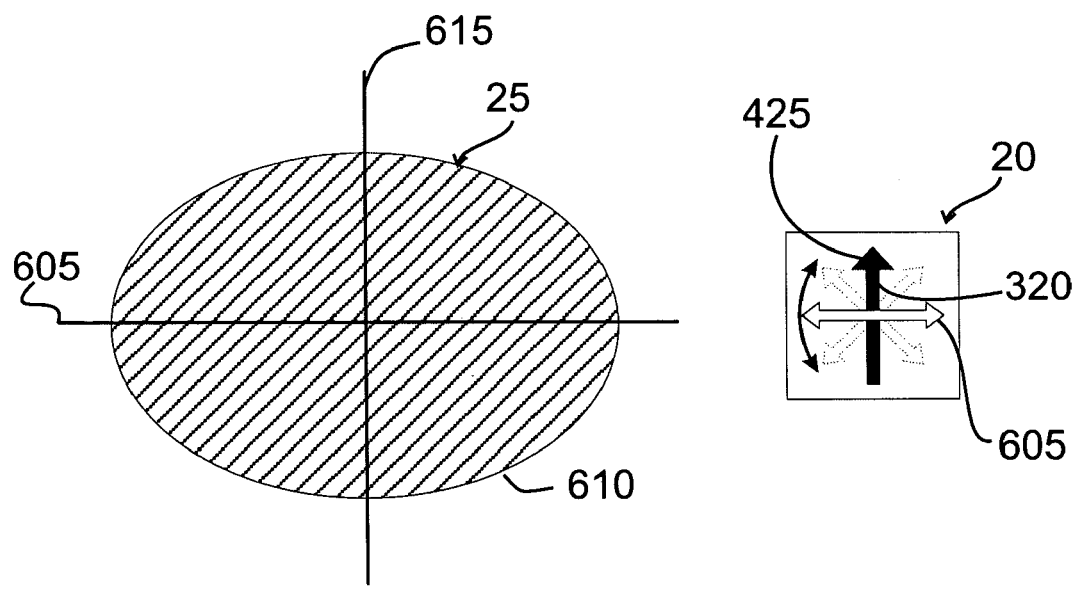

FIG. 6 (FIGS. 6A, 6B) further illustrates embodiments of the reading element 20A with cross section drawings of the data column 25 and the reading device 20A. While the cross-section of the data column 25 is illustrated in FIG. 6 as being oval shaped, other cross-sectional shapes are also contemplated by the present invention, such as for example, circular, square, rectangular, or other shapes.

In FIG. 6A, the reading element 20A is positioned such that the fixed magnetic moment 320A is largely parallel to a major axis 605 of the data column 25. In general, the fixed magnetic moment 320A is positioned perpendicular to a circumference 610 of the data column 25. FIG. 6B illustrates one embodiment in which the reading element 20A is positioned such that the fixed magnetic moment 320A is largely parallel to the minor axis 615 of the data column 25. In general, the fixed magnetic moment 320A is positioned parallel to the circumference 610 of the data column 25.

In both FIG. 6A and FIG. 6B, a free magnetic moment 605 is biased in a direction that is perpendicular to that of the fixed magnetic moment 320A. Application of a fringing field to the reading element 20A causes the free magnetic moment 605 to rotate up to 90° and align with the fixed magnetic moment 320A while pointing in the opposite direction of the fixed magnetic moment 320A. This embodiment allows a reading element more sensitivity to the fringing fields of the domains, providing reading of data in the magnetic shift register with lower magnitude fringing fields.

Figure 7A:
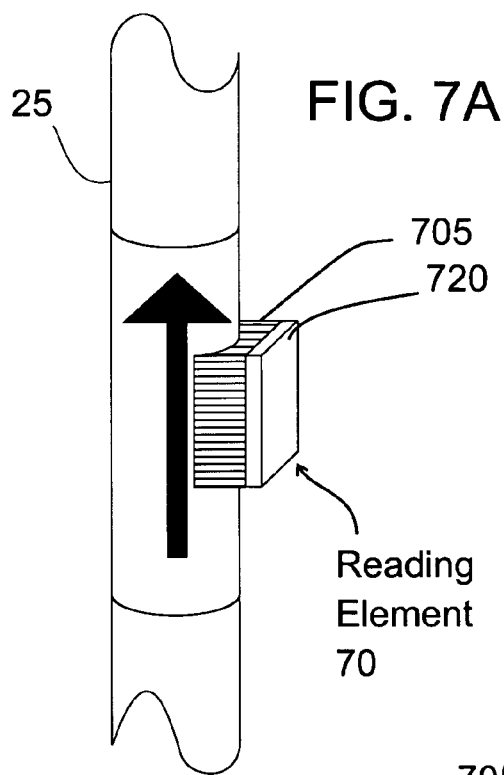
FIG. 7 is comprised of FIGS. 7A, 7B, 7C, which illustrate further exemplary embodiments of the reading element according to the present invention.

FIG. 7 shows further exemplary embodiments of reading elements 20. FIG. 7A shows a reading element 70 in which the data column 25 forms one magnetic layer of the reading element. The reading element 70 is comprised of a fixed magnetic layer 720 which is separated from the data column 25 by a thin insulating layer 705. Although the fixed magnetic layer 720 is shown as a flat, planar layer, this layer can have curvature(s) and, for example, can have a surface topology that generally conforms to that of the surface of the data column 25, whereby the thickness of the insulating spacer layer 705 will be approximately the same across the area of the layer 720. It may also be advantageous for improved magnetic operation of the reading element 70 that the thickness of the spacer or insulating layer 705 is increased towards the edges of the fixed magnetic layer 720, so that the magnetoresistive signal from the reading element 70 is not sensitive to the edges of the fixed magnetic layer 720.

Figure 7B:
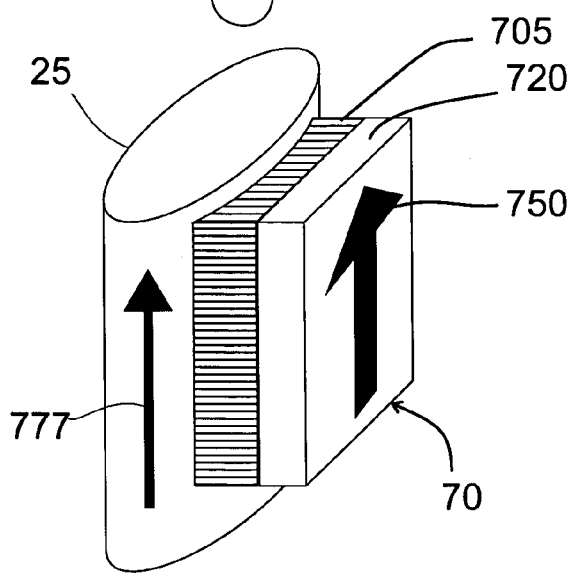
Figure 7C:
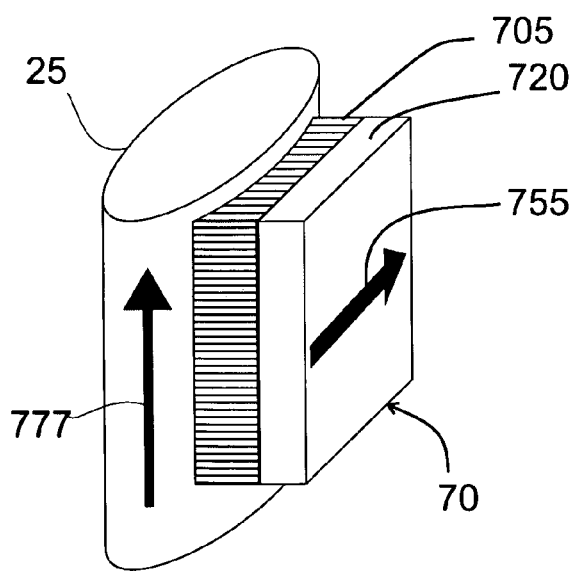
Figures 8A, 8B:
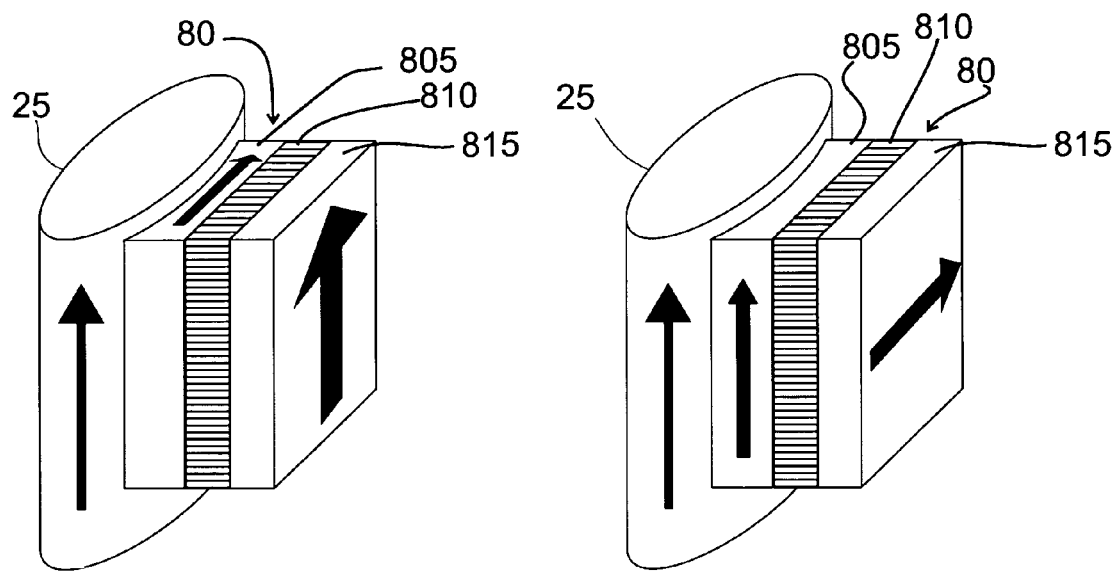
FIG. 8 is comprised of FIGS. 8A, 8B, 8C, 8D, which illustrate additional exemplary embodiments of the reading elements according to the present invention.
Figures 8C, 8D:
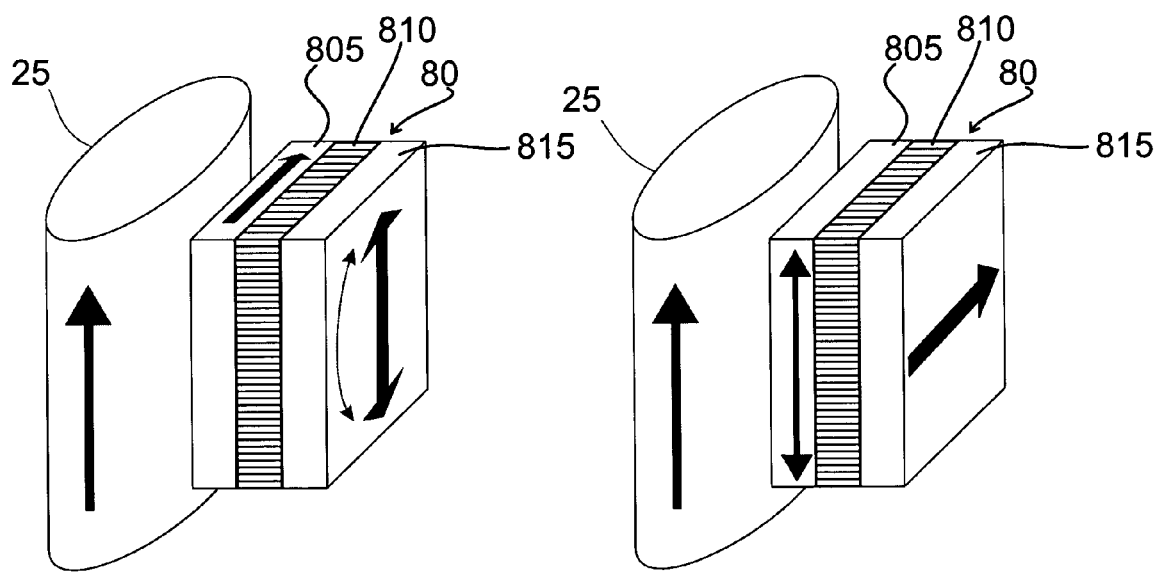

FIGS. 7B and 7C show exemplary examples of the reading element 70 in which the directions of the magnetization 750, 755, of the fixed magnetic layer 720 are respectively oriented parallel to, or orthogonal to, that of the direction of magnetization 777 in the data column 25.

FIGS. 8A through 8D illustrate additional exemplary embodiments of reading element 80 in which the reading element 80 abuts the data column 25 but in which a sense layer 805 of the reading element 80 is contiguous with the data column 25. The reading element 80 is comprised of a fixed magnetic layer 815 which is separated from the data column 25 by the sense layer 805 and the thin insulating layer 705. FIGS. 8A through 8D illustrate various directions of magnetization of the layers forming the reading element 80. Although the fixed magnetic layer 815 is shown as a flat, planar layer, this layer can have curvature(s) and, for example, can have a surface topology that generally conforms to that of the surface of the data column 25, whereby the thickness of the sense layer 805 and the insulating spacer layer 810 will be approximately the same across the area of the layer 720.

Figure 9A:
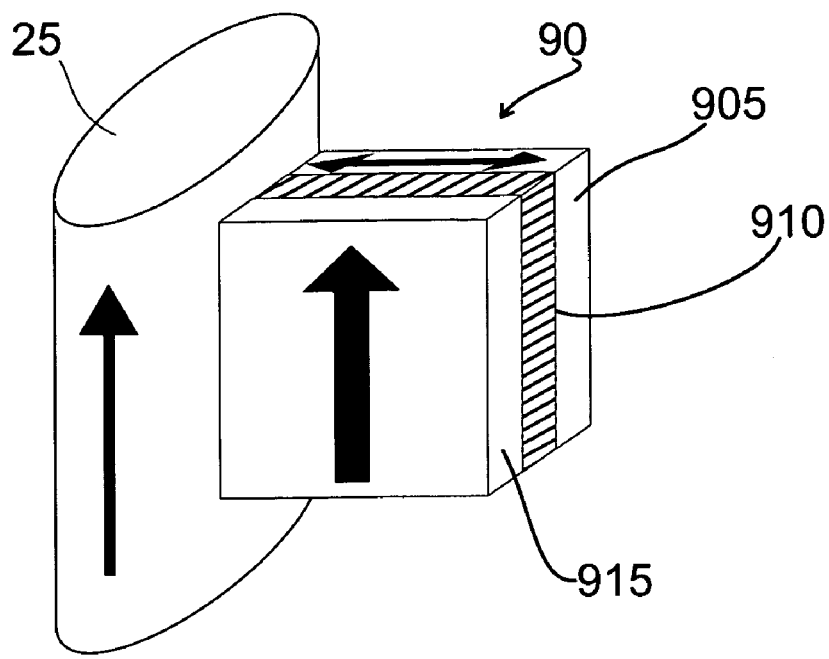
FIG. 9 is comprised of FIGS. 9A, 9B, which illustrate additional exemplary embodiments of the reading elements according to the present invention.
Figure 9B:
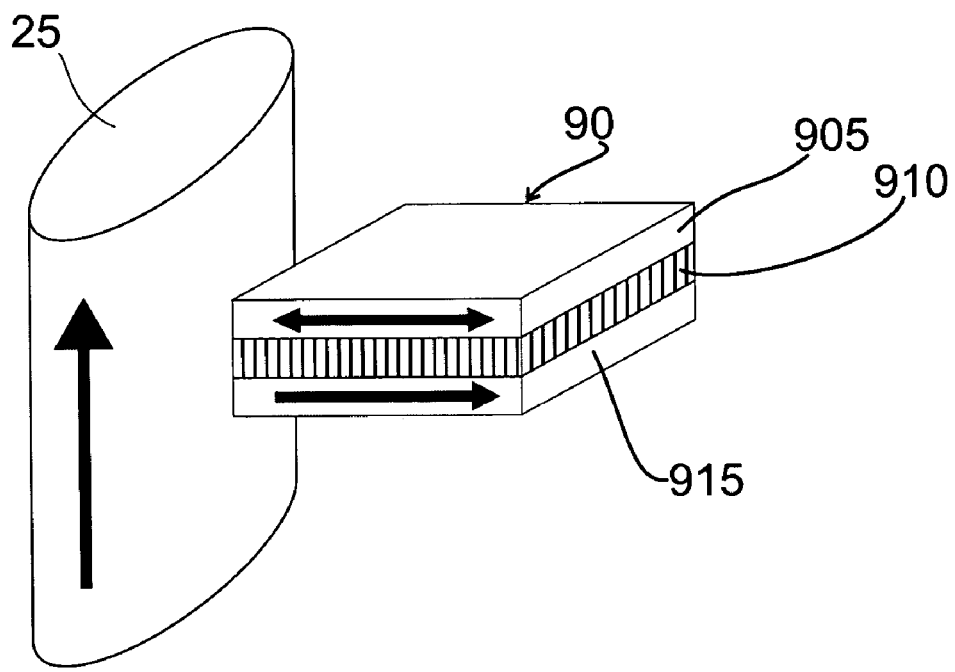

FIGS. 9A and 9B illustrate yet other exemplary embodiments of reading element 90 in which in which the reading element 90 abuts the data column 25 but in which a sense layer 905 of the reading element 90 is contiguous with the data column 25. The direction of the magnetization of the sense layer 905 of the reading element 90 is set perpendicular to that of a pinned or reference layer 915. The reading element 90 further includes an insulation or separation layer 910 that is interposed between the sense layer 905 and the pinned layer 915.

Figure 10A:
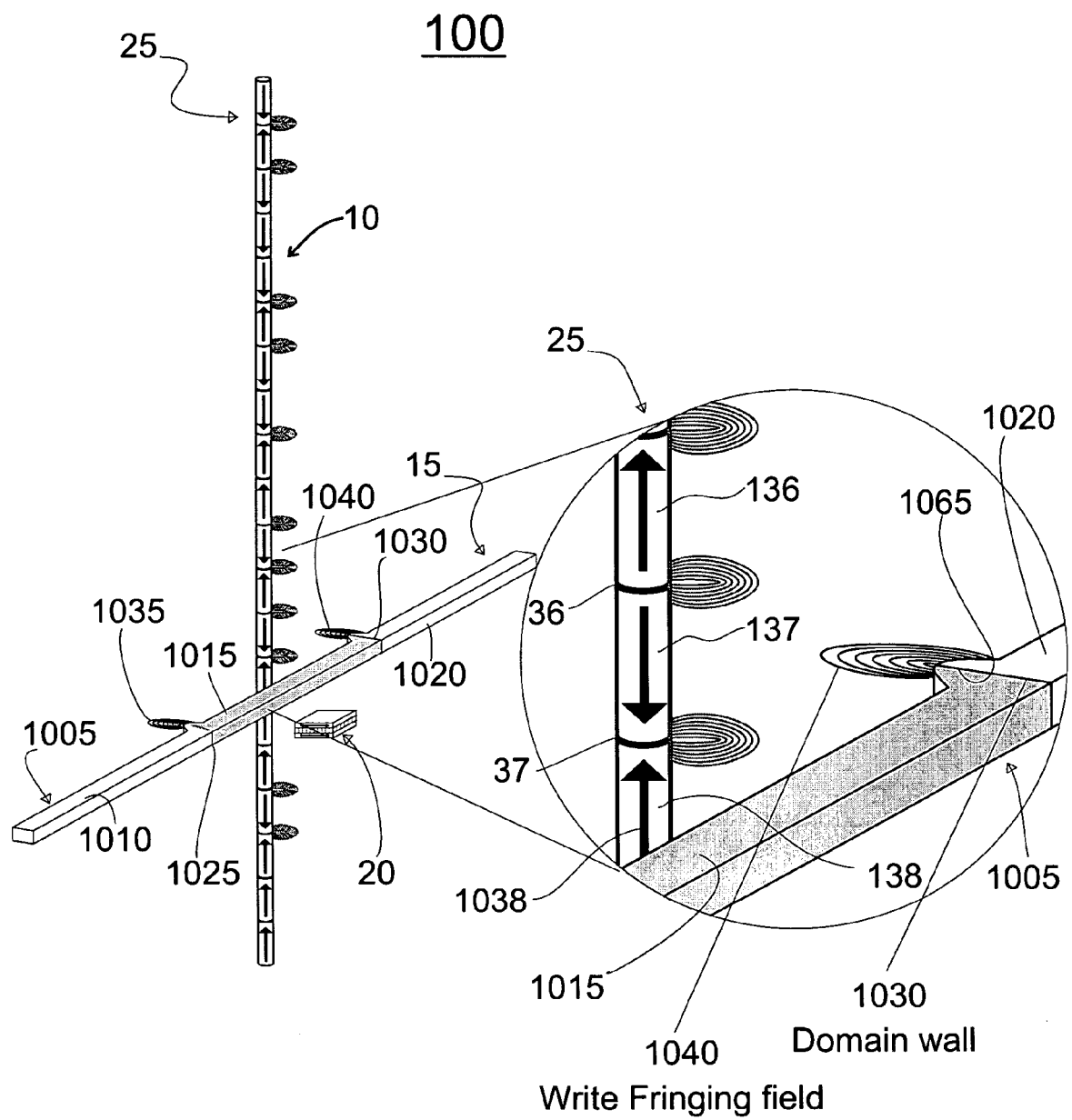
FIG. 10 is comprised of FIGS. 10A, 10B, which illustrate the data writing process using the writing element, according to the present invention.
Figure 10B:
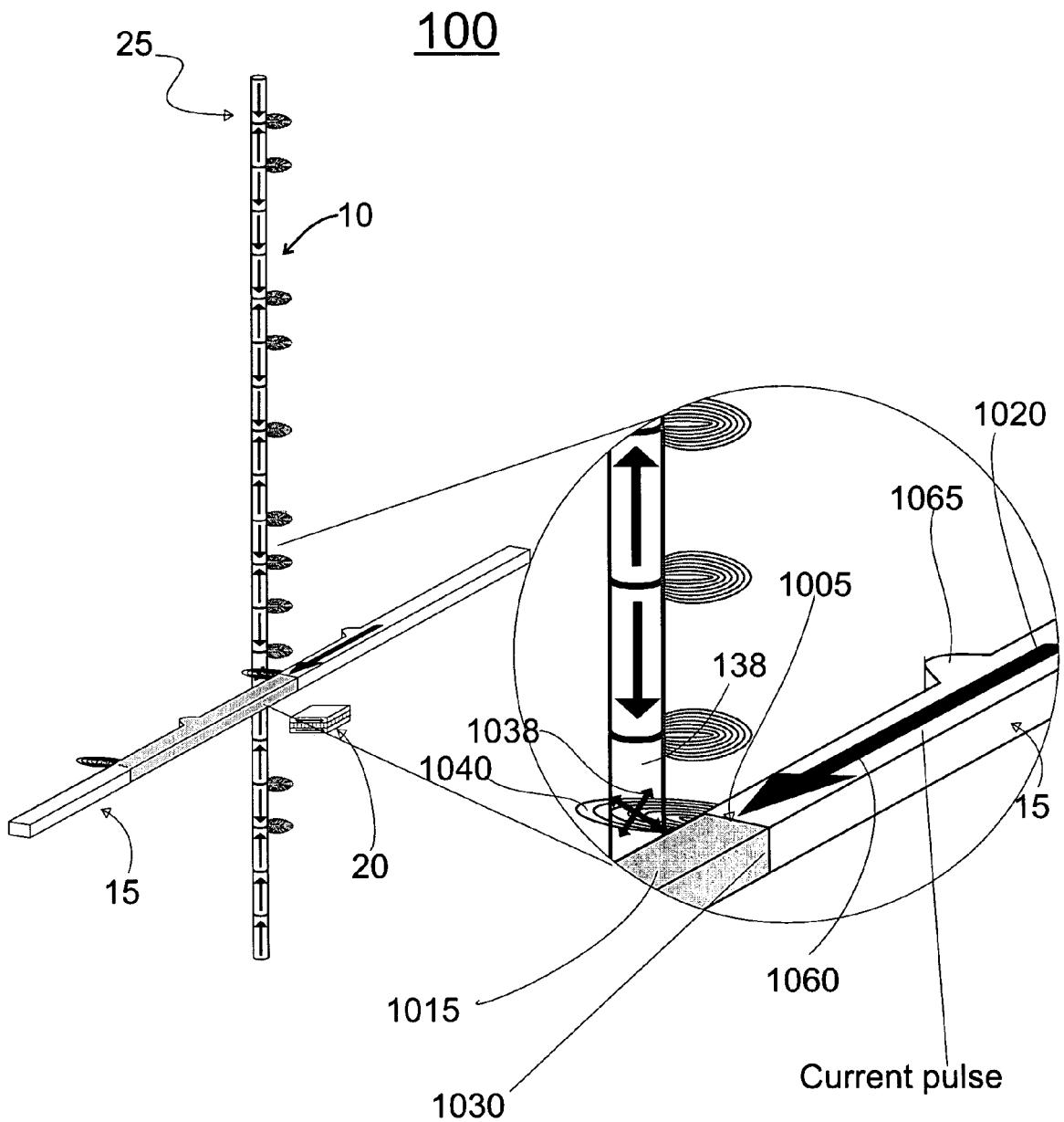

The writing element 15, shown in FIG. 10 (FIGS. 10A and 10B), is comprised of a magnetic (ferromagnetic or ferromagnetic) wire 1005 placed near the data column 25 of the magnetic shift register 10. As illustrated for exemplary purposes, the ferromagnetic wire 1005 is comprised of domains 1010, 1015, and 1020. Between these domains 1010, 1015, 1020 are domain walls 1025, 1030. Associated with domain wall 1025 is fringing field 1035; while domain wall 1030 has fringing field 1040. According to a preferred embodiment, the locations of the reading element 20 and the write element 15 are fixed relative to the data column 25. According to other embodiments, the location of the reading element 20, the location of the write element 15, or the locations of both the reading element 20 and the writing element 15 could be varied, either dynamically, or programmably relative to the data column 25.

When any one of the domain walls 1025, 1030 of the writing element 15 passes near the region closest to the data column 25, either of the large magnetic fields 1035, 1040 associated with the domain walls 1025, 1030, respectively, can be used to write data in the domains 136, 137 of the data column 25.

To write the data, the writing element 15 changes the magnetic moment of a domain 138 in the data column 25. The magnitude of the fringing field 1040 applied to the data column 25 decreases rapidly outside the region around the domain walls 1025, 1030, either in the writing element 15 or the data column 25. The magnitude of magnetic field 1040 applied by the writing element 15 to the data column 25 can be controlled simply by controlling the relative location of the domain wall 1025, 1030 in the writing element 15.

FIG. 10B illustrates the writing process using the writing element 15. As an electric pulse (current or sequence of pulses) 1060 is applied to the writing element 15, the domain wall, e.g., 1030, moves in one direction along the magnetic wire 1005 until the domain wall 1030 is adjacent to the domain 138 of the data column 25, causing the direction of magnetization 1038 of the domain 138 to be reversed.

Figure 11:
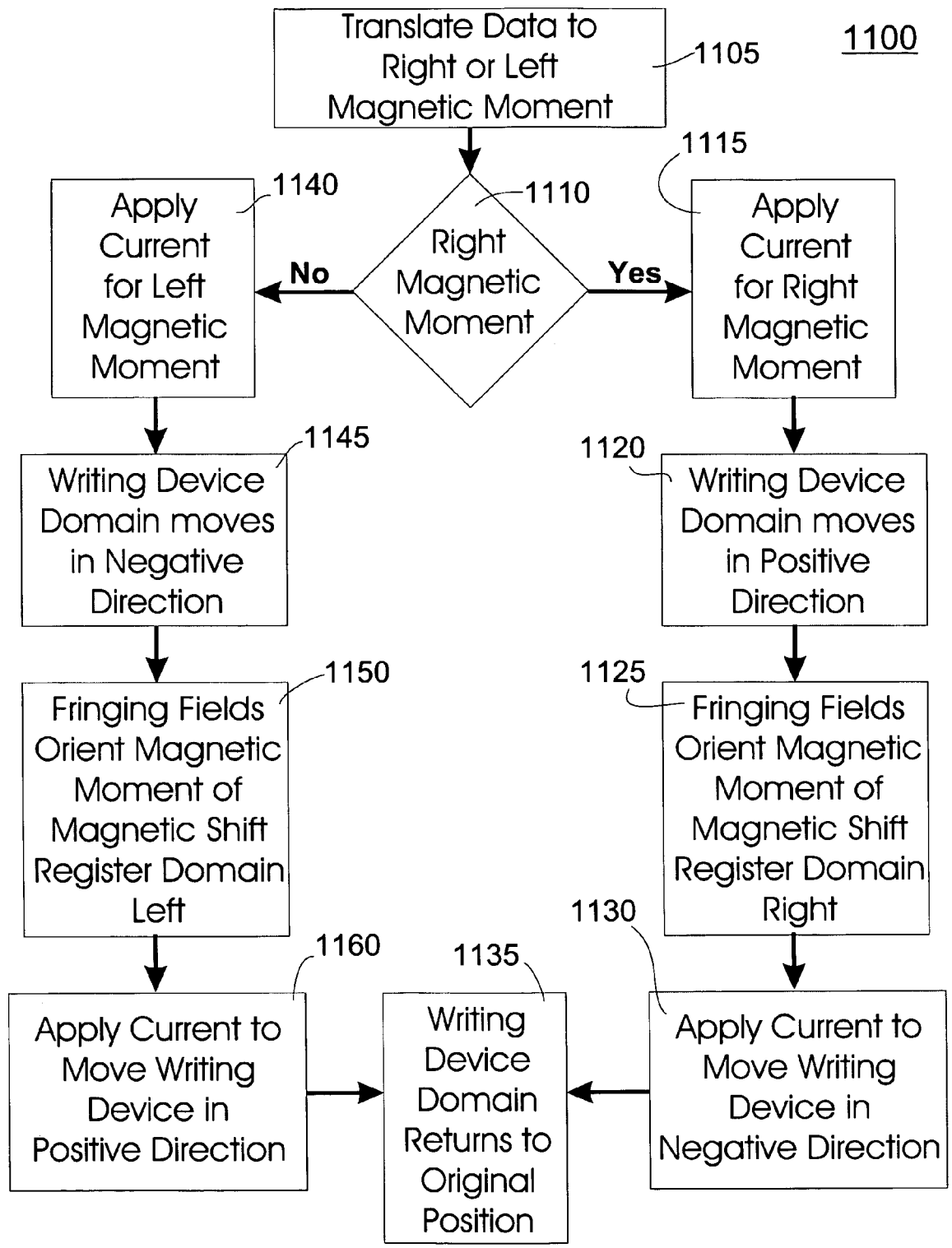
FIG. 11 is a flow chart illustrating a method of writing data using the writing element according to the present invention.

Method 1100 of the writing element 15 is described by the process flow chart of FIG. 11, with further reference to FIG. 10. The domain wall 1030 and its associated magnetic fringe field 1040 are shown in their quiescent positions outside a write region of the writing element 15. A request to write data is received by the memory system (not shown). At block 1105, the memory system translates the data (0 or 1) into whether the domain 1045 receives a magnetic moment pointing right (a right magnetic moment) or a magnetic moment pointing left (a left magnetic moment).

If, at decision block 1110, the domain 138 of the data column 25 is to be written with a right magnetic moment, method 1100 proceeds to block 1115. At block 1115, a current 1060 is applied to the writing element 15 in FIG. 10A, moving the domain wall 1030 in the positive direction (block 1120), as denoted by the direction of the arrow. Fringing field 1040 is now within the write region. The magnetic fringe fields write to the magnetic shift register 10 (block 1125), changing the direction of the magnetization of domain 1045.

A current 1060 is then applied to the writing element 15 (block 1130) and the domain 1015 is returned to its quiescent position (block 1135). The domain wall 1030 is in close proximity of the data column 25 for only an instant, and during that instant it writes to the magnetic material of the data column 25, domain 138. The magnitude of fringing field 1040 applied to domain 138 is large only when the domain wall 1030 of the writing element 15 is near the data column 25.

If, at decision block 1110, the domain 138 is to be written with a left magnetic moment, method 1100 proceeds to block 1140. At block 1140, a current 1050 is applied to the writing element 15, moving the domain wall 1030 in the negative direction (block 1145). Fringing field 1035 is now within the write region. The magnetic fringe field 1035 writes to the data column 25 (block 1150), changing the direction of the magnetization of domain 138. A current 1060 is then applied to the writing element (block 1155), causing the writing element domain 1015 is returned to its quiescent position (block 1135).

As shown in FIG. 10 (FIGS. 10A, 10B), the domain wall 1025, 1030 is brought close to the data column 25 by means of an arch-shaped bend 1065 in the wire 1005 of the writing element 15. Current 1060 applied to the writing element 15 pushes the domain wall 1030 very close to data column 25, enhancing the effect of the fringing fields from domain wall 1030. In one embodiment, the wire 1005 does not comprise the arch-shaped bend 1065, rather comprising a straight round, square, or other shaped wire comprising a domain wall situated adjacent to data column 25.

As illustrated in FIG. 10 (FIGS. 10A, 10B) the location of the domain wall 1025, 1030 is controlled by applying current 1060 to the writing element 15. Current 1060 is applied in a direction corresponding to the arrow to the writing element 20, moving the fringing field 1040 of the domain wall 1035 of the data column 25. As the fringing field 1040 passes through domain 1045, the magnetic moment of domain 1045 is aligned with the fringing field 1040.

Figure 12:
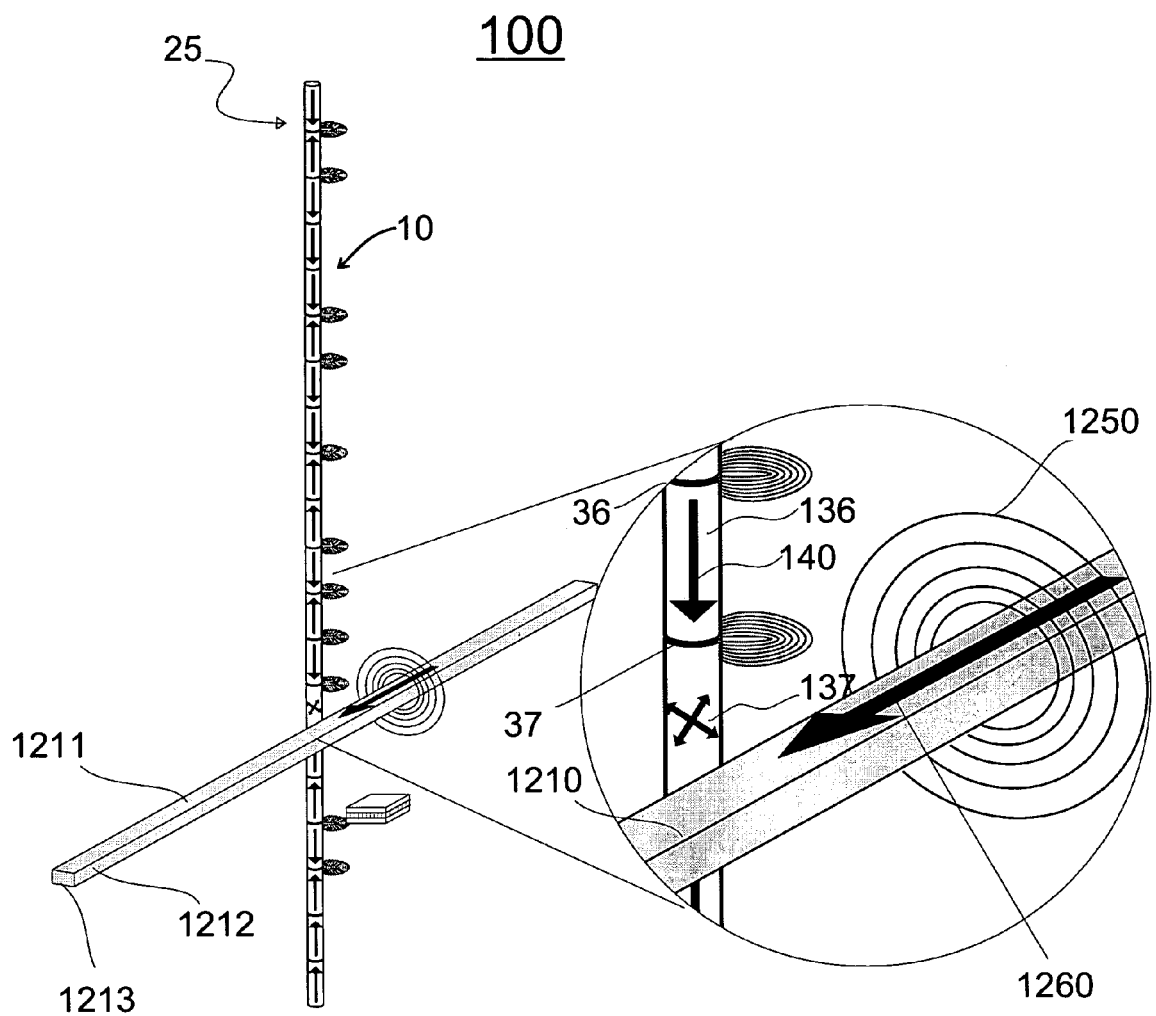
FIG. 12 illustrates another embodiment of the shift register in which the writing element uses a self field from a current pulse to write data to the data column.

FIG. 12 illustrates an embodiment in which the writing element 15 uses a self field 1250 from a current pulse to write to the magnetic shift register 100. In this embodiment, a pulse of current is passed in a wire 1210 positioned close to the data column 25. The pulse of current is sufficiently large that it generates an Oersted field 1250, which intersects with the data column 25, writing an element 136 in a direction indicated by the arrow 140. The direction of the written domain can be changed by changing the direction of the current pulse along the wire.

By having multiple wires arranged along the length of a race track, multiple bits can be written at the same time. The wire 1210 can be formed from a non-magnetic material such as copper or aluminum. The wire 1210 can also be surrounded by soft magnetic material on one or more sides of the wire to both increase the magnitude of the Oersted field and to shield the field from neighboring race tracks. For example, it may be advantageous to clad the sides at the top 1211, the side of the wire away from the race track 1212 and the bottom of the wire 1213 with a soft magnetic material such as permalloy. Thus, the field will now be created on the side of the wire 1210 closest to the data column 25 and with greater intensity than would otherwise be the case without the magnetic cladding. This not only allows the use of a smaller current, but can also create fields much larger than can be created by currents passing through non-magnetic conducting wires 1210 without exceeding the electromigration limit of the wire. The magnetic cladding on the three sides of the wire, which is contiguous at the corners of the wire, will shield the magnetic flux created by passing a current along the wire from neighboring magnetic shift registers 10.

Figure 13:
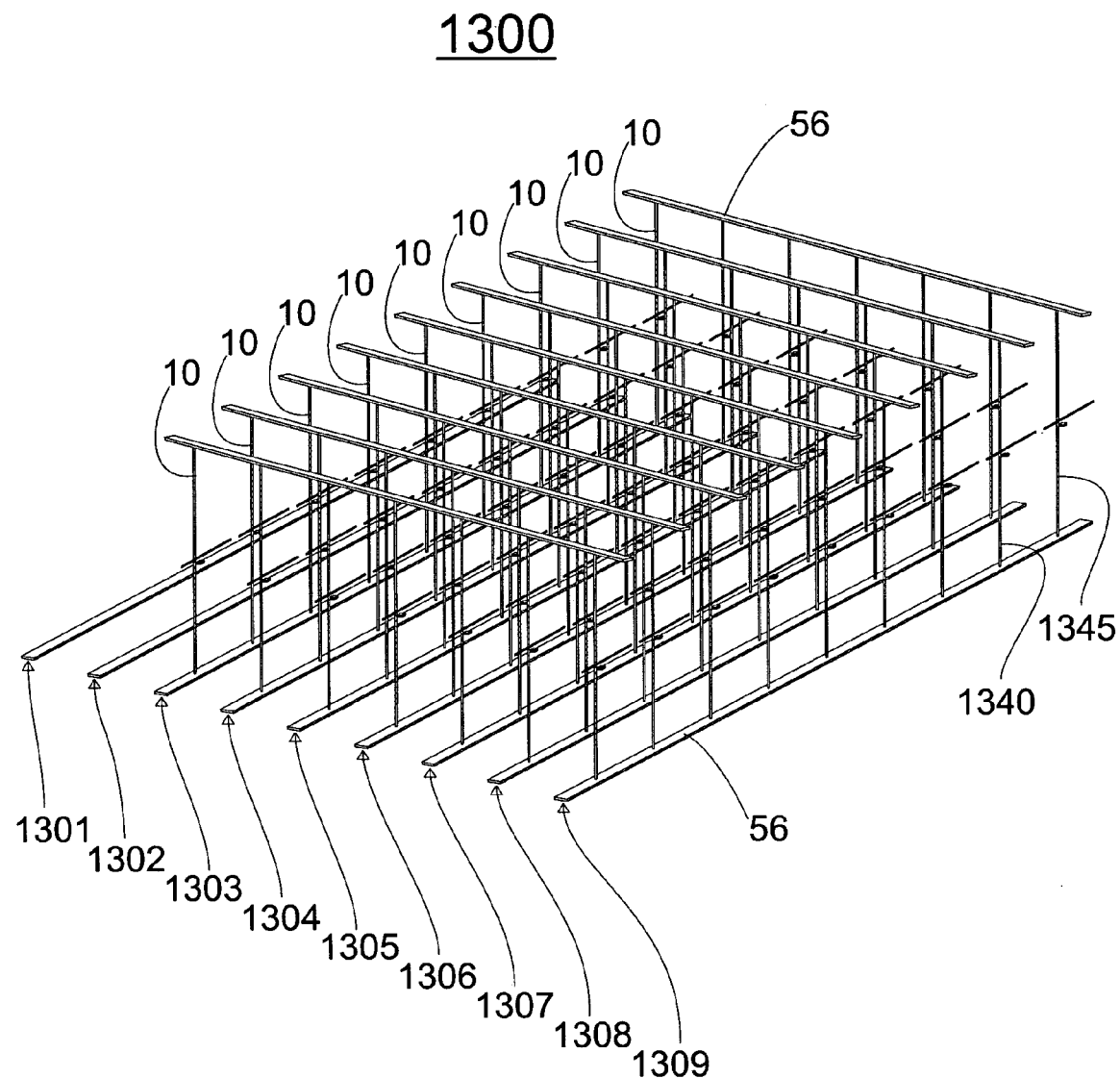
FIG. 13 illustrates a magnetic memory system comprised of an array of magnetic shift registers according to the present invention.

FIG. 13 illustrates a magnetic memory system 1300 according to one embodiment of the present invention. The magnetic memory system 1300 is comprised of a plurality of the magnetic shift registers 10 (or a combination of other suitable shift registers described herein) that are connected in an array configuration. The array configuration is shown for example purpose only, as comprising nine rows 1301–1309 of the magnetic shift registers 10, with each row comprised of numerous shift registers 10. The magnetic shift registers 10 in each row are connected in parallel. The sections, i.e., 1340, 1345, that connect the magnetic shift registers 10 in one row, i.e., row 1309, can be a high conductivity material such as copper, or a ferromagnetic material, such as that used in the magnetic shift array 1300. The magnetic memory system 1300 further includes one or a plurality of read elements 20 and write elements 15.

It is to be understood that the specific embodiments of the invention that have been described are merely illustrative of certain applications of the principle of the present invention. Numerous modifications can be made to system and method for reading from and writing to a magnetic shift register comprising a data column described herein without departing from the spirit and scope of the present invention.

What is claimed is:

1. A data shift register comprising:
   a plurality of discrete magnetized regions that form a data column, wherein data are selectively stored in the magnetized regions; and
   wherein the magnetized regions translate along the data column, in response to an electric pulse that passes through at least a portion of the data column.

2. The data shift register of claim 1, wherein the data column comprises a data region in which data are stored in the magnetized regions, and a reservoir region that receives the magnetized regions as the magnetized regions translate along the data column.

3. The data shift register of claim 2, wherein the reservoir comprises discrete first and second reservoirs.

4. The data shift register of claim 3, wherein the data region is interposed between the first and the second reservoirs; and
   wherein, in response to the electric pulse, the data region translates, along the data column, between the first and second reservoirs.

5. The data shift register of claim 4, wherein the first reservoir is sufficiently long to accommodate all the magnetized regions in the data region.

6. The data shift register of claim 2, wherein the reservoir region is sufficiently long to accommodate all the magnetized regions in the data region.

7. The data shift register of claim 2, wherein the magnetized regions comprise a plurality of domain walls that form transitions between the magnetic domains.

8. The data shift register of claim 7, wherein as the electric pulse passes through a first magnetic domain, the electric pulse becomes spin polarized; and
   wherein as the spin-polarized electric pulse passes into a second domain that is adjacent to the first domain, across a domain wall, the electric pulse develops a spin torque that forces the domain wall to move in a direction that corresponds to a direction of the electric pulse.

9. The data shift register of claim 1, further comprising a reading element for reading data from at least some of the magnetized regions.

10. The data shift register of claim 1, further comprising a write element for writing data in at least some of the magnetized regions.

11. The data shift register of claim 10, further comprising a reading element for reading data from at least some of the magnetized regions.

12. The data shift register of claim 11, wherein the reading element comprises a magnetic tunnel junction.

13. The data shift register of claim 12, wherein the magnetic tunnel junction does not contact the data column.

14. The data shift register of claim 12, wherein the magnetic tunnel junction reads data stored in the magnetized regions by interacting with magnetic fields from the magnetized regions.

15. The data shift register of claim 12, wherein the magnetic tunnel junction abuts against the data column.

16. The data shift register of claim 12, wherein the data column forms part of the magnetic tunnel junction.

17. The data shift register of claim 12, wherein the magnetic tunnel junction comprises an insulation layer that is interposed between a magnetic layer of the tunnel junction and the data column.

18. The data shift register of claim 12, wherein the magnetic tunnel junction comprises:
   a pinned layer with a fixed magnetic moment;
   a free layer with a free magnetic moment;
   wherein the free magnetic moment aligns with, and points in a same direction as, the fixed magnetic moment in a first state of the reading element; and
   wherein the free magnetic moment aligns with, and points in an opposite direction as, the fixed magnetic moment in a second state of the reading element.

19. The data shift register of claim 18, wherein the fixed magnetic moment is oriented perpendicularly to an axis of the data column.

20. The data shift register of claim 18, wherein the fixed magnetic moment is oriented parallel to an axis of the data column.

21. The data shift register of claim 18, wherein the fixed magnetic moment of the pinned layer remains unchanged during an operation of the data shift register.

22. The data shift register of claim 21, wherein the pinned layer is fixed by an exchange bias layer.

23. The data shift register of claim 21, wherein the pinned layer is fixed by a magnetically hard magnetic material.

24. The data shift register of claim 18, wherein the free magnetic moment is rotated by up to 90 degrees.

25. The data shift register of claim 10, wherein the write element comprises a wire made of magnetic material.

26. The data shift register of claim 25, wherein the write element comprises at least any one of a protuberance and a notch to fix the domain wall of the wire.

27. The data shift register of claim 25, wherein the wire has any one of an oval-shaped, square-shaped, circular, and rectangular cross-section.

28. The data shift register of claim 10, wherein the wire of the write element comprises at least one magnetic domain wall bounded by two magnetic domains.

29. The data shift register of claim 28, wherein the write element selectively writes data in the magnetic domains of the data column by inducing motion of the domain wall of the write element in proximity to the magnetic domains of the data column to be written.

30. The data shift register of claim 1, wherein the magnetized regions comprise respective magnetic domains separated by domain walls.

31. The data shift register of claim 1, further comprising at least one read element disposed in proximity to the data column to read data stored in at least some of the magnetized regions; and
  at least one write element disposed in proximity to the data column to write data in at least some of the magnetized regions.

32. The data shift register of claim 1, wherein the data column has any one of an oval-shaped, square-shaped, circular, and rectangular cross-section.

33. A magnetic data storage system comprising:
  a plurality of data shift registers that are electrically interconnected in parallel, wherein each data shift register comprises the data shift register of claim 1.

34. The magnetic data storage system of claim 33, wherein the magnetized regions form a plurality of data columns and comprise respective magnetic domains for storing the data.

35. The magnetic data storage system of claim 34, wherein the magnetized regions comprise respective domain walls for storing the data.

36. The magnetic data storage system of claim 34, wherein the data columns are connected to respective first and second terminals; and
  wherein the first and second terminals are connected to a control circuit.

37. The magnetic data storage system of claim 36, wherein the control circuit comprises a current source that supplies the electric pulse to move the magnetized regions along the data columns.

38. The magnetic data storage system of claim 36, further comprising at least one read element disposed in proximity to the columns to read data stored in at least some of the magnetized regions.

39. The magnetic data storage system of claim 38, further comprising at least one write element disposed in proximity to the data columns to write data in at least some of the magnetized regions.

40. The magnetic data storage system of claim 36, further comprising at least one write element disposed in proximity to the data columns to write data in at least some of the magnetized regions.

41. A method of writing data on a magnetic data shift register that includes a data column having a plurality of magnetized regions with magnetic moments, and a write element disposed in proximity to the data column that generates a fringing field, the method comprising:
  moving the fringing field of the write element adjacent to at least one magnetized region of the data column, to change the direction of the magnetic moment of the at least one magnetized region and thereby write data in the at least one magnetized region.

42. The method of claim 41, wherein the write element comprises at least one least one domain wall.

43. The method of claim 42, wherein moving the fringing field of the write element comprises passing a current pulse through the write element, to move the at least one domain wall in a direction that changes the direction of the magnetic moment of the at least one magnetized region of the data column.

44. The method of claim 42, wherein the write element comprises a first domain wall and a second domain wall; and
  wherein moving the fringing field of the write element comprises moving the first domain wall to cause the magnetic moment of the at least one magnetized region of the data column to be oriented along a first direction; and
  further moving the second domain wall to cause the magnetic moment of the at least one magnetized region of the data column to be oriented along a second direction.

45. The method of claim 42, further comprising moving the magnetized regions of the data column so that another magnetized region of the data column is disposed in proximity to the write element for writing data therein.

46. The method of claim 45, wherein moving the magnetized regions of the data column comprises passing a current pulse through the data column for moving at least some of the magnetized regions of the data column along the data column.

47. The method of claim 41, further comprising translating the data to be written in the direction of the magnetic moment of the magnetized region.

48. The method of claim 47, wherein the direction of the magnetic moment is the right direction to reflect a right magnetic moment, and the left direction to reflect a left magnetic moment.

49. The method of claim of claim 48, wherein moving the fringing field comprises applying a current pulse that directs the magnetic moment of the magnetized region in the direction of the magnetic moment.

50. The method of claim 42, wherein the data column comprises a data region that includes the magnetized regions in which data are stored, and a reservoir region that receives the magnetized regions as the magnetized regions translate along the data column.

51. A method of reading data on a magnetic data shift register that includes a data column having a plurality of magnetized regions, and a read element disposed in proximity to the data column, the method comprising:
  selectively moving a fringing field associated with the at least one magnetized region, in proximity to the read element, to enable the read element to read the data stored in the at least one magnetized region; and wherein moving the fringing field comprises passing a current pulse through at least part of the data column.

52. The method of claim 51, wherein the reading element comprises a magnetic tunnel junction.

53. The method of claim 52, wherein the magnetic tunnel junction comprises a free magnetic moment; and wherein the fringing field induces a change in direction in the free magnetic moment, changing an electric resistance of the magnetic tunnel junction to reflect a value of the data stored in the at least one magnetized region.

54. The method of claim 51, wherein the magnetized regions comprise at least one magnetic domain that stores the data to be read.

55. The method of claim 51, wherein the magnetized regions comprise at least one domain wall that stores the data to be read.

56. The method of claim 51, wherein the data column comprises a data region that includes the magnetized regions in which data are stored, and a reservoir region that receives the magnetized regions as the magnetized regions move along the data column.

* * * * *